United States Patent
Yamazaki

(10) Patent No.: US 7,800,436 B2
(45) Date of Patent: Sep. 21, 2010

(54) SIGNAL EXTRACTION CIRCUIT

(75) Inventor: Daisuke Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/129,440

(22) Filed: May 29, 2008

(65) Prior Publication Data

US 2008/0265987 A1     Oct. 30, 2008

Related U.S. Application Data

(63) Continuation of application No. PCT/JP2005/022006, filed on Nov. 30, 2005.

(51) Int. Cl.
*H03D 1/10* (2006.01)
*H03D 1/04* (2006.01)

(52) U.S. Cl. .................. 329/350; 329/369; 329/370; 340/10.1

(58) Field of Classification Search ............... 340/10.1, 340/10.34; 329/347, 350, 369, 370
See application file for complete search history.

(56) References Cited

U.S. PATENT DOCUMENTS

| 6,323,728 | B1 | 11/2001 | Schmitt-Landsiedel et al. |
| 6,859,640 | B2 * | 2/2005 | Bardouillet et al. .......... 455/41.1 |
| 2003/0197598 | A1 | 10/2003 | Hayashi |

FOREIGN PATENT DOCUMENTS

| JP | 11-120306 A | 4/1999 |
| JP | 11-215026 A | 8/1999 |
| JP | 2002-99887 A | 4/2002 |
| JP | 2003-296683 A | 10/2003 |
| JP | 2004-348661 A | 12/2004 |

* cited by examiner

*Primary Examiner*—Robert Pascal
*Assistant Examiner*—James E Goodley
(74) *Attorney, Agent, or Firm*—Fujitsu Patent Center

(57) ABSTRACT

A shunt regulator performs a control so as to stabilize a voltage obtained by rectifying the radio frequency signal output from an antenna unit at a prescribed voltage value. A signal extraction unit extracts the information signal from a bypass current sent by the shunt regulator for the control when the voltage fluctuates.

16 Claims, 17 Drawing Sheets

SIGNAL EXTRACTION CIRCUIT

CROSS REFERENCE TO RELATED APPLICATION

This application is a continuation application of international PCT application No. PCT/JP2005/022006 filed on Nov. 30, 2005.

BACKGROUND OF THE INVENTION

1. Field of the Invention

The present invention relates to a technique for extracting a signal and in particular to a technique for extracting an information signal from a radio frequency signal on which the information signal is superimposed.

2. Description of the Related Art

A noncontact data carrier, such as a radio frequency identification (RFID) tag and a noncontact integrated circuit (IC) card, does not equip itself with a power supply such as a battery and instead secures the power from the energy of electromagnetic waves, which is emitted by a reader/writer apparatus for access, and performs a data communication by utilizing the electromagnetic waves.

As one example of noncontact data carriers, the RFID tag is described here. FIG. 1 is a block diagram exemplifying the configuration of a conventional RFID tag.

This RFID tag comprises an antenna unit 101, a rectification circuit 102, a capacitor C100, a shunt regulator 103, a signal extraction circuit 104, a demodulation circuit 105, a digital signal process unit 106, memory 107 and a modulation circuit 108.

A reader/writer apparatus emits an electromagnetic wave, to the antenna, by feeding a radio frequency signal on which an information signal is superimposed. Having received the electromagnetic wave, the antenna 101 outputs a radio frequency wave on which the information signal is superimposed. The output radio frequency signal is rectified by the rectification circuit 102, is charged in the capacitor C100, and then is converted into the current flowing in the digital signal process unit 106. The shunt regulator 103 performs a control so as to stabilize, at a predetermined voltage value, a voltage obtained by the rectification circuit 102 rectifying the radio frequency signal.

The signal extraction circuit 104 extracts a reception signal (i.e., the original information signal) superimposed on the signal of the power supply. The demodulation circuit 105 generates signal data on the basis of the extracted reception signal (i.e., an extraction signal $I_{SIG}$). The signal data is then subjected to signal processing at the digital signal process unit 106. In this event, the digital signal process unit 106 reads or writes data from or to the memory 107 as appropriate. Meanwhile, the modulation circuit 108 modulates the impedance of the antenna unit 101 in accordance with a transmission signal generated by the digital signal process unit 106.

Next is a description of FIG. 2, which is a diagram exemplifying the circuit configurations of the antenna unit 101, rectification circuit 102 and signal extraction circuit 104, all of which are shown in FIG. 1.

An amplification-modulated, such as an amplitude shift keying (ASK) modulation, electromagnetic wave reaches at the antenna unit 101 and an antenna excitation voltage VA is generated therein. Here, the antenna unit 101 generates the input voltage VB to the rectification circuit 102 by virtue of the resistance R10 of the antenna unit 101 per se.

The rectification circuit 102, being a full-wave rectification circuit constituted by diodes D101 and D102, causes the capacitors C101 and C102 to generate a power supply voltage VDD1. Incidentally, the sign "VSS" is a grounding voltage.

Meanwhile, the antenna unit 101 causes also the signal extraction circuit 104 to generate likewise the input voltage VB. The signal extraction circuit 104 comprises a rectification circuit, which is constituted by the diodes D103 and D104 and by the capacitors C103 and C104, to generate a voltage signal VDD2 by rectifying the input voltage VB, that is, an input signal. The demodulation circuit 105 generates and outputs signal data in accordance with the generated voltage signal VDD2.

Note that a half-wave rectification circuit and a bridge rectification circuit and the like are also known as a rectification circuit, with all of the rectification circuits possessing the function of making a power supply by rectifying a voltage excited in an antenna and that of rectifying a signal and leading it to a demodulation circuit for extracting signal data.

Also note that U.S. Pat. No. 6,323,728 has disclosed a technique adding an element between a rectification circuit and a voltage control circuit controlling a power supply voltage for monitoring a post-rectification current.

With regard to the conventional noncontact data carrier, there is a problem in which an attempt to secure a stable power supply voltage makes it difficult to extract a signal.

This problem is described by taking the configuration shown in FIG. 2 as example.

The demodulation circuit 105, which extracts a signal component from an amplitude-modulated signal, such as the ASK modulation, by using signal data, demodulates a signal on the basis of the difference between an antenna-excitation voltage VA1 when the signal data of a reception signal is "0" and an antenna-excitation voltage VA2 when the signal data is "1". Here, the definition is that the sign Ra is the value of a resistor (i.e., an impedance) R101 possessed by the antenna unit 101, the VB1 is the input voltage of the rectification circuit 102 when the signal data is "0", the VB2 is the input voltage of the rectification circuit 102 when the signal data is "1", the VDD1 is the power supply voltage after being rectified by the rectification circuit 102, the VDD2 is the input voltage, which is generated by the signal extraction circuit 104, of the demodulation circuit 105, the Vth is a threshold voltage common to the diodes D101, D102, D103 and D104, which are rectification elements, and the Ron is a turn-on resistance common to the diodes D101, D102, D103 and D104.

In this case, the input voltage VB1 when the signal data is "0" is represented by the following expression:

$$VB1 = VA1 - (VA1 - VDD1/2 - Vth) * Ra/(Ra + Ron) \quad (1)$$

Likewise, the input voltage VB2 when the signal data is "1" is represented by the following expression:

$$VB2 = VA2 - (VA2 - VDD1/2 - Vth) * Ra/(Ra + Ron) \quad (2)$$

From the above expressions (1) and (2), the difference in voltage at the input to the rectification circuit 102 between the cases of the signal data being "0" and "1" is represented by the following expression:

$$VB1 - VB2 = (VA1 - VA2) - (VA1 - VA2) * Ra/(Ra + Ron) \quad (3)$$
$$= \Delta VA(1 - Ra/(Ra + Ron))$$

Here, the ΔVA represents the voltage difference (VA1−VA2) between the VB1 and VB2.

Therefore, the voltage difference ΔVDD2 at the input to the demodulation circuit 105 between the cases of the signal data being "0" and "1" can be represented by the following expression:

$$\Delta VDD2 = (VB1 - Vth) - (VB2 - Vth) \quad (4)$$
$$= VB1 - VB2$$
$$= \Delta VA(1 - Ra/(Ra + Ron))$$

That is, the voltage difference for the demodulation circuit 105 to discern between the signal data "0" and "1" is the product of coefficients greatly depending only on a voltage VA excited in the antenna and the turn-on resistance of the rectification element. Therefore, if a rectification element having a small turn-on resistance Ron is selected, the difference in amplitude at the input terminal of the demodulation circuit 105 becomes two small to discern a signal level.

On the other hand, the turn-on resistance of a rectification element needs to be minimized for effectively securing the power of a power supply and therefore a stable power supply is difficult to be secured if the turn-on resistance of the rectification element is increased by putting an emphasis on the signal detection.

Further, in the case of adopting the configuration of adding an element between the rectification circuit and voltage control circuit for monitoring an electric current as the technique disclosed in the above noted U.S. Pat. No. 6,323,728, a voltage drop corresponding to the added element occurs due to the addition of the current monitor in the power supply path, thus resulting in reducing the efficiency of rectification.

As described above, the noncontact data carrier such as an RFID tag and IC card requires an achievement of mutually incompatible functions, that is, both an obtainment of a stable power supply voltage and a firm demodulation (i.e., a signal extraction).

SUMMARY OF THE INVENTION

According to one aspect of the present invention, a signal extraction circuit for extracting an information signal from a radio frequency signal has a shunt regulator for performing a control so as to stabilize a voltage obtained by rectifying the radio frequency signal at a prescribed voltage value; and a signal extraction unit for extracting the information signal from a bypass current sent by the shunt regulator for the control when the voltage fluctuates.

BRIEF DESCRIPTION OF THE DRAWINGS

The present invention will be more apparent from the following detailed description when the accompanying drawings are referenced.

DESCRIPTION OF THE PREFERRED EMBODIMENTS

The following is a description of the preferred embodiment of the present invention by referring to the accompanying drawings.

Figure 1:
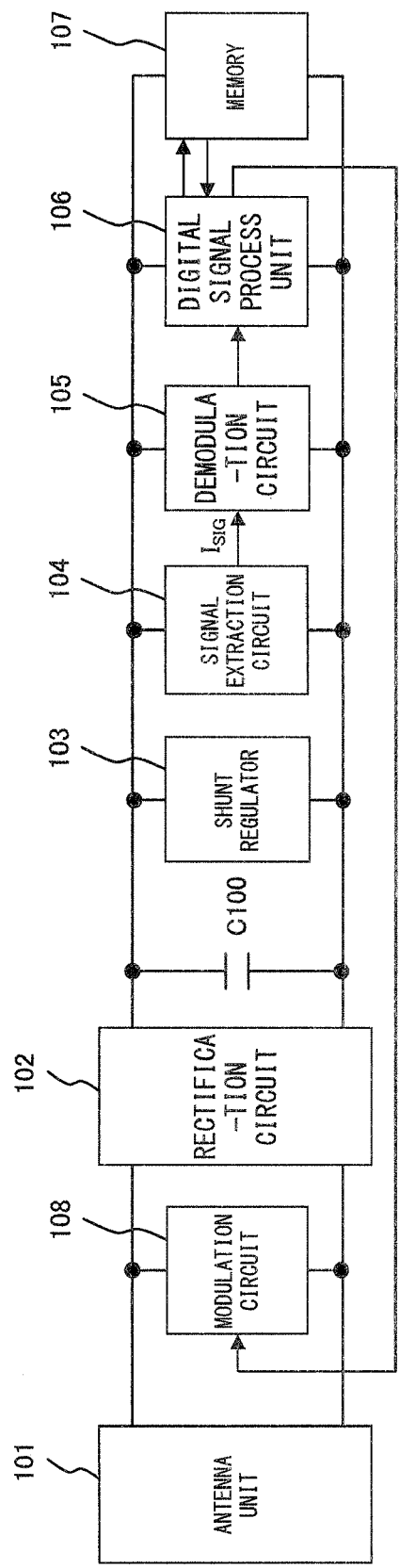
FIG. 1 is a block diagram exemplifying the configuration of a conventional RFID tag.
Figure 2:
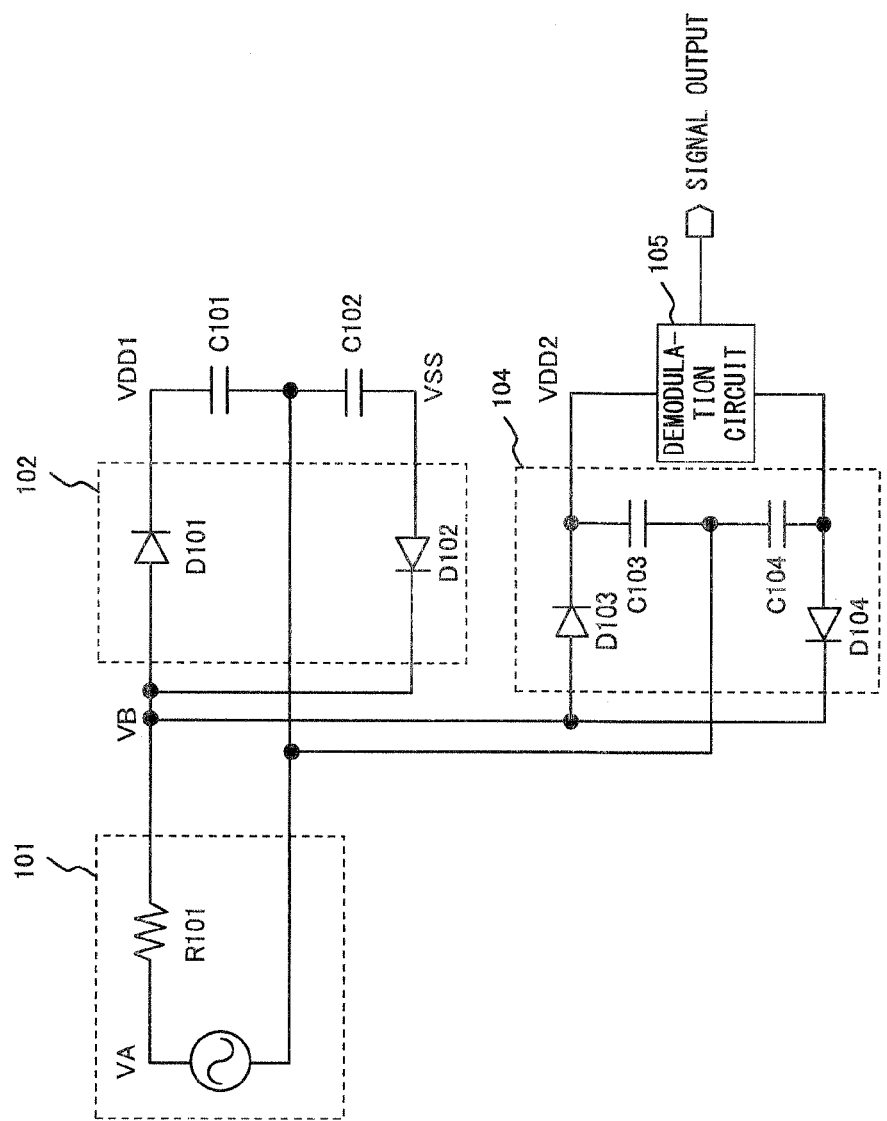
FIG. 2 is a diagram describing the problem of a signal extraction at a conventional noncontact data carrier.
Figure 3:
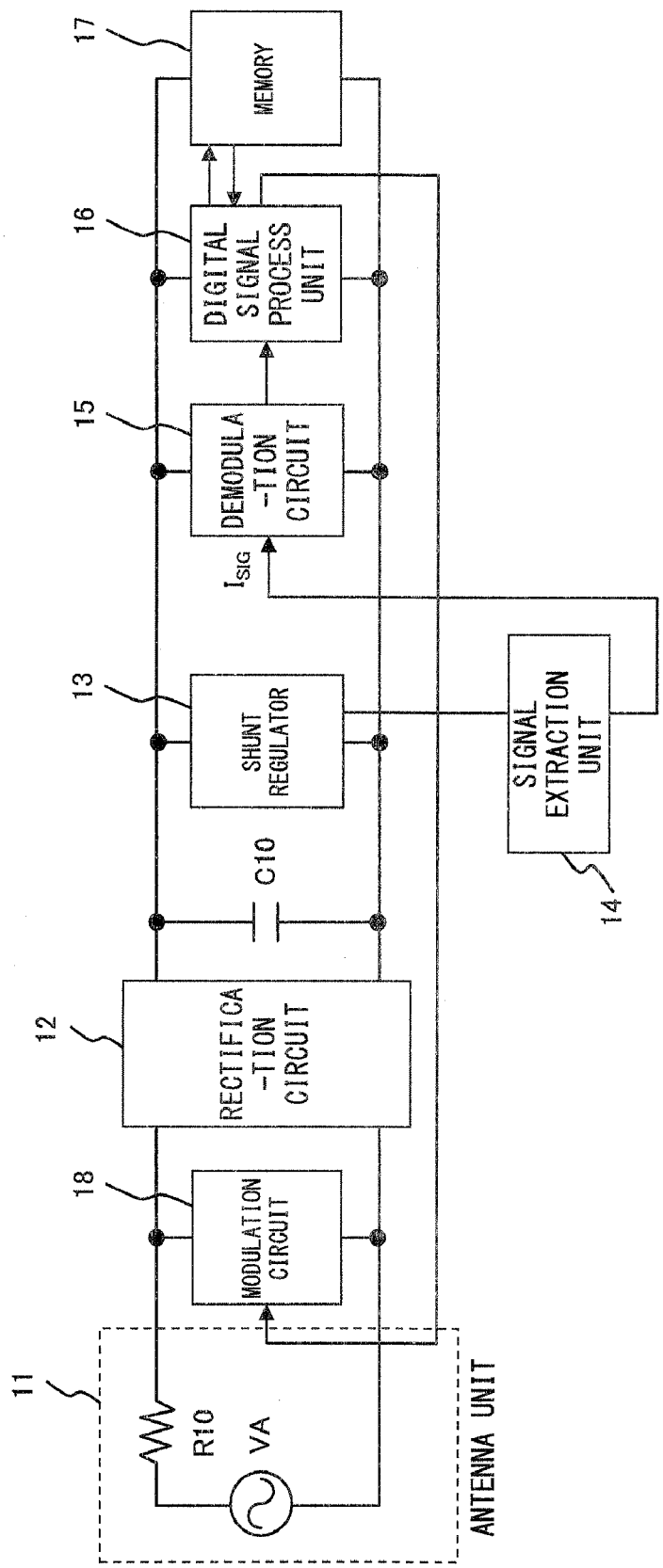
FIG. 3 is a block diagram showing a first example of the configuration of an RFID tag.

First is a description of FIG. 3, which is a block diagram showing a first example of the configuration of a radio frequency identification (RFID) tag which is a noncontact data carrier.

The RFID tag comprises an antenna unit 11, a rectification circuit 12, a capacitor C10, a shunt regulator 13, a signal extraction unit 14, a demodulation circuit 15, a digital signal process unit 16, memory 17 and a modulation circuit 18.

A reader/writer apparatus emits an electromagnetic wave by feeding to the antenna a radio frequency signal, on which an information signal is superimposed by using an amplitude modulation such as ASK modulation. Having received the electromagnetic wave, the antenna 11, in which a voltage VA is excited, outputs a radio frequency wave superimposed by the information signal. Note that the resistor R10 represents the impedance of the antenna unit 11.

The radio frequency signal output from the antenna unit 11 is rectified by the rectification circuit 12 and a power supply signal component is extracted from the signal so that the power supply signal component is changed in the capacitor C10 to become the power supply for the digital signal process unit 16.

The shunt regulator 13 performs a control so as to stabilize a voltage obtained by rectifying the radio frequency signal at a prescribed voltage value. The shunt regulator 13 is mostly for stabilizing the fluctuation of the present voltage caused by the change in distance from the reader/writer apparatus and yet functions so as to stabilize the present voltage even if the amplitude of an information signal is fluctuated as a result of the information signal being amplitude-modulated by the carrier wave (i.e., a radio frequency signal).

The signal extraction unit 14 extracts the original information signal, which has been superimposed by the reader/writer apparatus, from a bypass current (i.e., a current from the power supply node to the ground node) sent by the shut regulator 13 for performing the above described control when the voltage obtained by rectifying the present radio frequency signal increases.

The demodulation circuit 15 generates signal data on the basis of the extracted information signal (i.e., an extraction signal $I_{SIG}$). The signal data is thereafter subjected to a signal processing at the digital signal process unit 16. In this event, the digital signal process unit 16 reads or writes data from or to the memory 17 as appropriate. Meanwhile, the modulation circuit 18 modulates the impedance of the antenna unit 11 in accordance with a transmission signal generated at the digital signal process unit 16.

The RFID tag shown in FIG. 3 is configured as described above. Note that a noncontact IC card embodying the present invention can be configured in a similar manner as that shown in FIG. 3.

Figure 4:
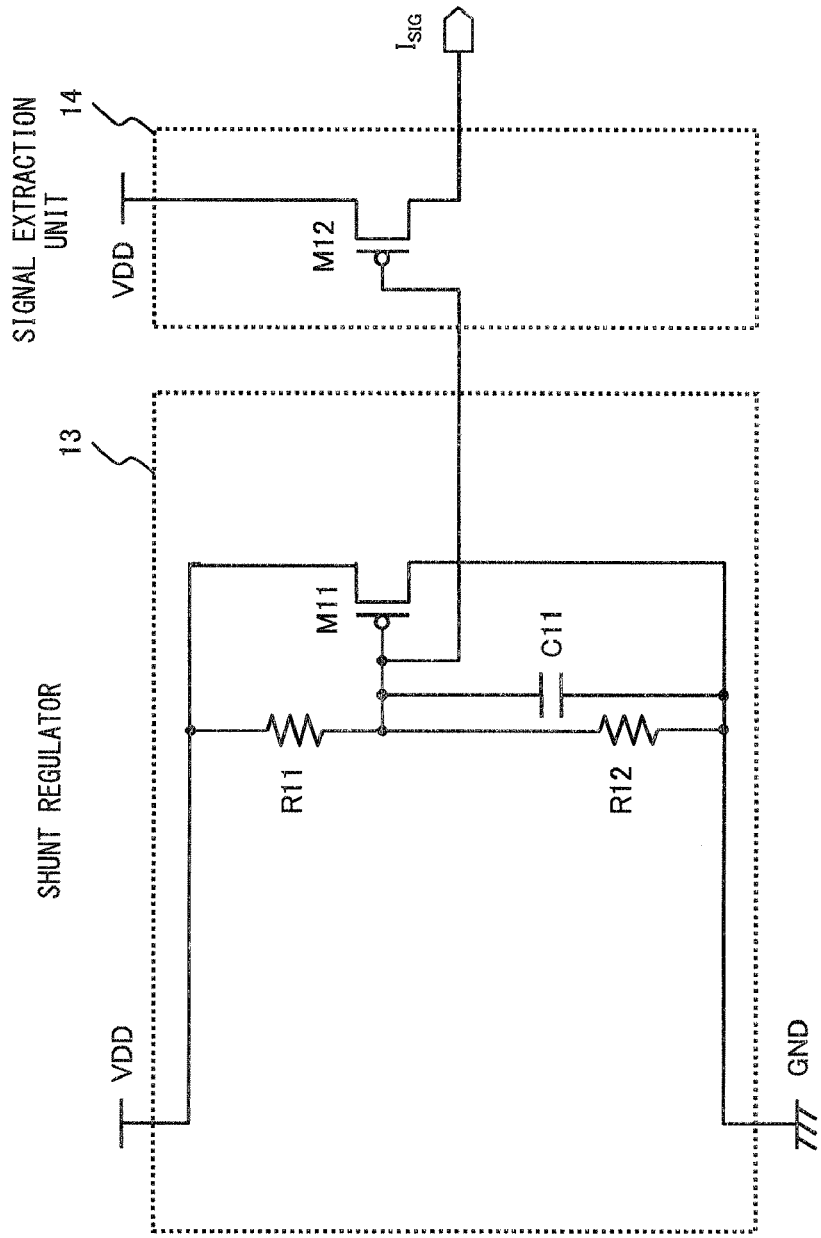
FIG. 4 is a block diagram showing a first example of the specific circuit configuration of a signal extraction circuit for extracting an information signal from a bypass current sent by the shunt regulator shown in FIG. 3.

Next is a description of FIG. 4 which shows a first example of the specific circuit configuration of a signal extraction circuit for extracting an information signal from a bypass current sent by the shunt regulator 13.

Referring to FIG. 4, the transistors M11 and M12 are p-MOS transistors.

The shunt regulator 13 comprises the transistor M11, resistors R11 and R12 and a capacitor C11.

The transistor M11 is a bypass transistor sending a bypass current between the drain and source thereof for stabilizing a voltage VDD, at a prescribed voltage value, when the voltage VDD obtained by the rectification circuit 12 rectifying the radio frequency signal fluctuates.

The above described voltage VDD is applied to the source of the transistor M11 and the drain thereof is connected to a ground node. The resistor R11 is parallelly connected between the gate and the source of the transistor M11 and the resistor R12 is parallelly connected between the drain and the gate thereof. Therefore, a gate voltage $[\{R12/(R11+R12)\}*VDD]$, which is obtained by dividing the voltage VDD by the resistors R11 and R12, is applied to the gate of the transistor M11.

In this event, a bypass current, of which the value is determined by both the transmission characteristic of the transistor M11 and the voltage $[-\{R11/(R11+R12)\}*VDD]$ across the gate and the source of the transistor M11, flows between the source and the drain thereof. When the bypass current flows, the voltage VDD is lowered and accordingly the voltage across the gate and the source is also lowered. This prompts the bypass current to be decreased. The repetition of the control operation hereafter causes the voltage across the gate and the source and the bypass current to reach an equilibrium state at a prescribed voltage value and a prescribed current value, respectively.

Then, if the voltage VDD ascends, the bypass current is increased to prompt a control for decreasing the voltage VDD to be carried out, while if the voltage VDD descends, the bypass current is decreased to prompt a control for increasing the voltage VDD to be carried out. As a result, the voltage VDD is stabilized at a prescribed voltage value determined by the transmission characteristic of the transistor M11 and resistors R11 and R12.

Here, a change in the voltage VDD is represented by a change in the bypass current. The change in the voltage VDD is caused by a change in amplitude of the radio frequency signal and the change in amplitude is the information signal per se, which is superimposed on the radio frequency signal by using an amplitude modulation such as ASK modulation. That is, the change in the bypass current represents the original information signal.

Note that the capacitor C11 is equipped for increasing the gate voltage of the transistor M11 gradually from "0" (i.e., the voltage of a ground node) to the previous voltage if the voltage VDD is rapidly increased from zero volts caused by, for example, the antenna unit 11 suddenly receives a strong electromagnetic wave or the like cause. Such a gradual increase in the gate voltage causes a large amount of the present bypass current to flow and thereby the circuit at the later stage is protected from a surge voltage.

Meanwhile, the signal extraction unit 14 comprises the transistor M12.

A voltage VDD which is stabilized by the shunt regulator 13 is applied to the source of the transistor M12 and is at the same electric potential as that of the source of the transistor M11. Also, the gate of the transistor M12 is connected to the gate of the transistor M11 and therefore the same voltage as that of the gate voltage of the transistor M11 is applied to the gate of the transistor M12. Therefore, a current, of which the amount changes in a similar manner as the bypass current flowing between the source and the drain of the transistor M11, flows between the source and the drain of the transistor M12 to which the same voltage as the gate voltage of the transistor M11, that is, the bypass transistor, is applied. The current generated as corresponding to the bypass current is output from the drain of the transistor M12 as an extraction signal $I_{SIG}$. The change in the amount of the $I_{SIG}$ represents the original information signal. Thus, the original information is extracted.

Figure 5:
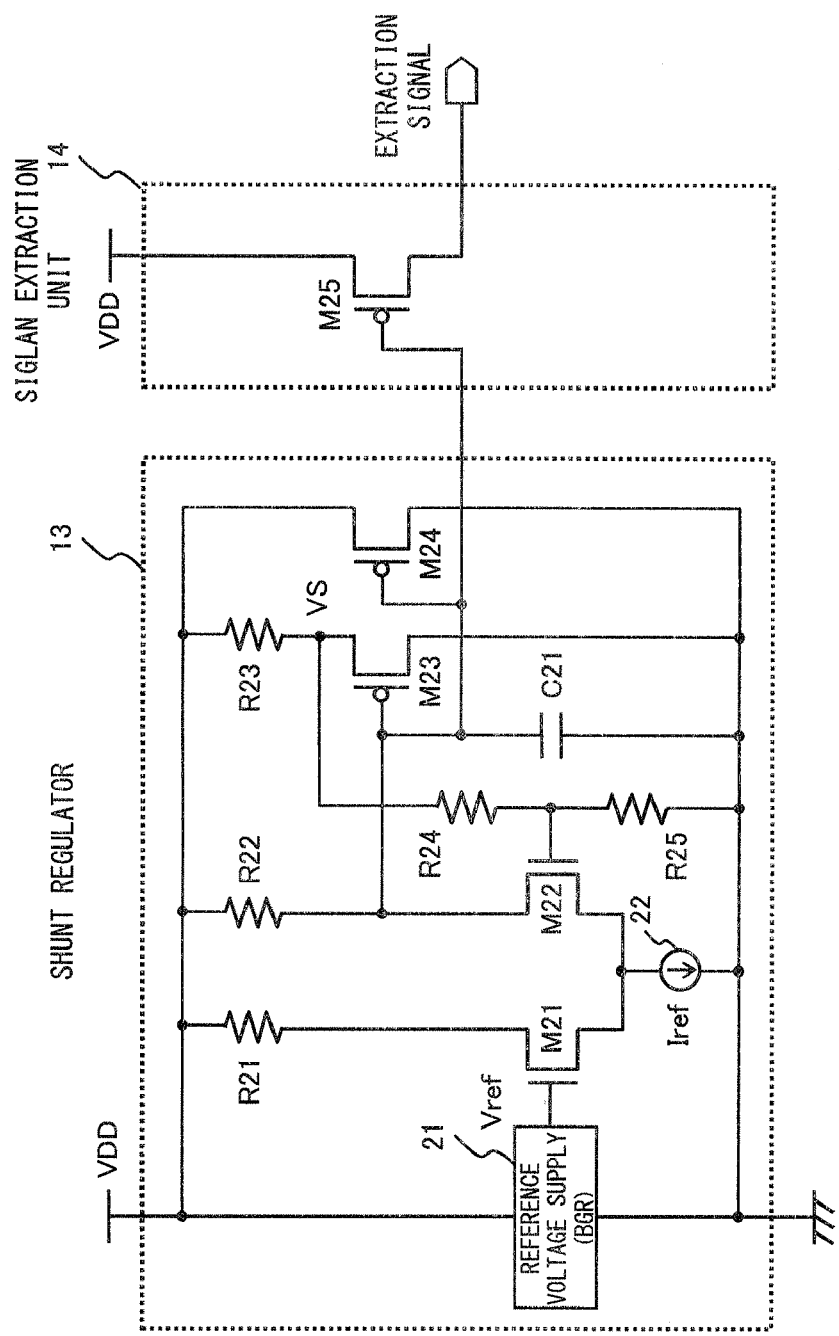
FIG. 5 is a block diagram showing a second example of the specific circuit configuration of a signal extraction circuit for extracting an information signal from a bypass current sent by the shunt regulator shown in FIG. 3.

Next is a description of FIG. 5 which shows a second example of the specific circuit configuration of a signal extraction circuit for extracting an information signal from a bypass current sent by the shunt regulator 13.

The difference between the configuration shown in FIG. 5 and that shown in FIG. 4 lies in the configuration which generates a voltage for controlling a bypass current to be sent to the bypass transistor in order to stabilize a voltage VDD.

Referring to FIG. 5, transistors M21 and M22 are n-MOS transistors, while transistors M23, M24 and M25 are p-MOS transistors.

A reference voltage supply 21 is a circuit for generating reference voltage Vref, that is, a constant voltage independent of the variation in voltage VDD, temperature and such, and uses a bandgap reference according to the present embodiment.

The voltage VDD is applied to the respective terminals, on one side, of the resistors R21 and R22, in both of which the resistance is the same, and the respective other terminals are connected to the respective drains of the transistors M21 and M22, in both of which the characteristics are uniform together. Further, the respective sources of the transistors M21 and M22 are interconnected and a constant current source 22 is inserted between the connection point and a ground node. That is, the resistors R11 and R12, transistors M21 and M22, and constant current source 22 constitute a differential circuit. Therefore, the gate voltage of the transistor M22 is equal to that of the transistor M21. Here, since the reference voltage Vref generated by the reference voltage supply 21 is applied to the gate of the transistor M21, the gate voltage of the transistor M22 is maintained at the reference voltage Vref. Note that a one half (½) current of the constant current Iref sent by the constant current source 22 flows in the resistor R22 in this event.

A resistor R25 is inserted between the gate and the ground node of the transistor M22 and a resistor R24 is further inserted between the gate of the transistor M22 and the source of the transistor M23. Meanwhile, the voltage VDD is applied to one terminal of the resistor R23 and the other terminal thereof is connected to the source of the transistor M23. The drain of the transistor M23 is connected to the ground node. Here, the transistor M23 is a bypass transistor in the shunt regulator 13 shown in FIG. 5 and the bypass current flows between the source and the drain thereof in accordance with the gate voltage of the transistor M23.

In the configuration of FIG. 5, little amount of current flows between the gate and the source of the transistor M22 and therefore almost all the current flowing in the resistor R24 flows to the resistor R25 Therefore, the source voltage Vs of the transistor M23 results in [{(R24+R25)/R25}*Vref].

The gate of the transistor M23 is connected to the connection point between the resistor R22 and transistor M22. In this case, the value of the resistor R22 is set so that the voltage across both terminals of the resistor R22 is at the threshold voltage Vth of the transistor M23, that is, the minimum voltage between the source and gate of the transistor M23 to bring up to the turn-on state (i.e., in short circuit) between the source and the drain of the transistor M23. Here, the threshold voltage Vth is a value determined by the characteristic of the transistor M23, and the current flowing in the resistor R22 is one half (½) of the constant current Iref sent by the constant current source 22. Therefore, the value of the resistor R22 can be determined by {(Vth/Iref)*2}. Note that the resistance value of the resistor R21 is also set at the same as that of the resistor R22.

The source voltage Vs of the transistor M23 is generated from the reference voltage Vref as described above and therefore is a constant voltage independent of the fluctuation of the voltage VDD, temperature or such. The transistor M23 becomes a turn-on state when the voltage VDD is only slightly higher than the source voltage Vs so that the voltage VDD is reduced by sending a bypass current between the source and the drain of the transistor M23 by way of the resistor R23. In contrast, the transistor M23 becomes a turn-off state when the voltage VDD is lower than the source voltage Vs so that the voltage VDD is increased by shutting off the bypass current. The operation of the transistor M23, that is, the bypass transistor, causes the voltage VDD to be stabilized at the source voltage Vs which is a constant voltage.

Here, the setup of the resistors R22 and R21 as described above causes the gate voltage of the transistor M23 to be set at a lower voltage than the voltage VDD (that is, the source voltage Vs) by the amount of the threshold voltage Vth. This results in reducing the influence of the variation in the threshold voltage Vth on the above described operation of the transistor M23.

As described above, the shunt regulator 13 shown in FIG. 5 is capable of stabilizing the voltage VDD at the voltage Vs highly accurately against the variations in the temperature and threshold voltage Vth.

Note that a capacitor C21 is inserted between the gate of the transistor M23 and the ground node. Similar to the capacitor C11 included in the shunt regulator 13 shown in FIG. 4, the capacitor C21 is equipped for increasing the gate voltage of the transistor M23 slowly from zero (i.e., the voltage of a ground node) to the above described voltage for letting a large amount of the bypass current flow when the voltage VDD has increased rapidly from zero, and thereby the later stage circuit is protected from a surge voltage. Further, the capacitor C21 also provides the effect of stabilizing the operation for controlling the voltage VDD performed by the shunt regulator 13 shown in FIG. 5.

The shunt regulator 13 shown in FIG. 5 further comprises a transistor M24. The gate of the transistor M24 is connected to the gate of the transistor M23 and the drain is connected to the ground node. A voltage VDD is applied to the source of the transistor M24.

If the voltage of the voltage VDD is high and the difference in potential relative to the source voltage Vs is large, a large amount of bypass current needs to be sent to the transistor M23 for stabilizing the voltage VDD at the source voltage Vs. Due to this reason, the mutual conductance of the transistor M23 is desired to be large. In the configuration shown in FIG. 5, however, the resistor R23 is connected to the source of the transistor M23 so that the resistor R23 reduces the circuit gain of the bypass circuit including the transistor M23.

The transistor M24 is equipped for the above described reason. The equipment of the transistor M24 as described above causes the transistor M24 to perform the On/Off operations similarly to the transistor M23 to send a bypass current between the source and the drain, thereby increasing the circuit gain of the bypass circuit. As a result, the shunt regulator 13 is enabled to send a larger amount of bypass current even if the difference in potential between the voltage VDD and source voltage Vs is large and thereby the voltage VDD can be stabilized at the source voltage Vs.

The signal extraction unit 14 in the configuration of FIG. 5 comprises the transistor M25.

The voltage VDD (that is, the source voltage Vs) stabilized by the shunt regulator 13 is applied to the source of the transistor M25. Further, the gate of the transistor M25 is connected to the gate of the transistor M23 and therefore the same voltage as the gate voltage of the transistor M23 is applied to the gate of the transistor M25. Therefore, a current, of which the amount is variable in a similar manner to the bypass current flowing between the source and the drain of the transistor M23, flows between the source and the drain of the transistor M25 in which the same voltage as the gate voltage of the transistor M23, that is, the bypass transistor, is applied to the gate. A current generated so as to correspond to the bypass current is output from the drain of the transistor M25 as an extraction signal $I_{SIG}$. The change in the amount of the $I_{SIG}$ represents the original information signal. The original information signal is thusly extracted.

Next is a description of the method for extracting the original information signal from a current flowing in a rectification circuit rectifying a radio frequency signal output from the antenna unit 11.

Figure 6:
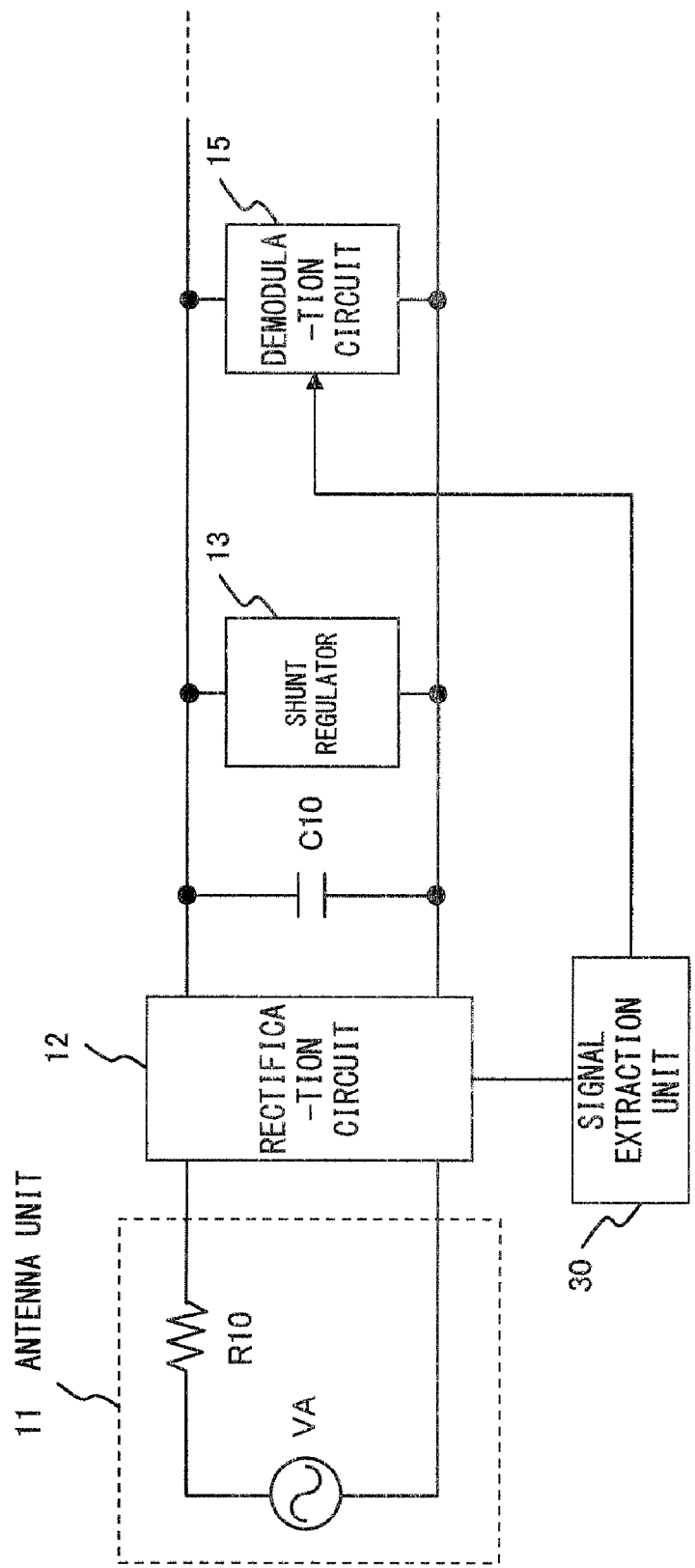
FIG. 6 is a block diagram showing the major part of a second example of the configuration of an RFID tag.

FIG. 6 is described first. FIG. 6 is a block diagram showing the major part of a second example of the configuration of an RFID tag which is a noncontact data carrier. The digital signal process unit 16, memory 17 and modulation circuit 18, among the comprisal shown in FIG. 3, are not shown in the drawing for simplicity.

Referring to FIG. 6, the antenna unit 11, rectification circuit 12, capacitor C10, shunt regulator 13 and demodulation circuit 15 are similar to those comprised in the second example of the configuration of the RFID tag shown in FIG. 3.

The first example shown in FIG. 3 is configured such that the signal extraction unit 14 extracts the original information signal from the bypass current sent by the shunt regulator 13 for performing a control for stabilizing the voltage output from the rectification circuit at a prescribed value. In contrast, the second example shown in FIG. 6 is configured such that a signal extraction unit 30 extracts the original information signal from the current flowing in the rectification circuit 12 rectifying a radio frequency signal output from the antenna 11.

The RFID tag shown in FIG. 6 is configured as described above. Note that the noncontact IC card embodying the present invention can also be configured similarly to that shown in FIG. 6.

Figure 7:
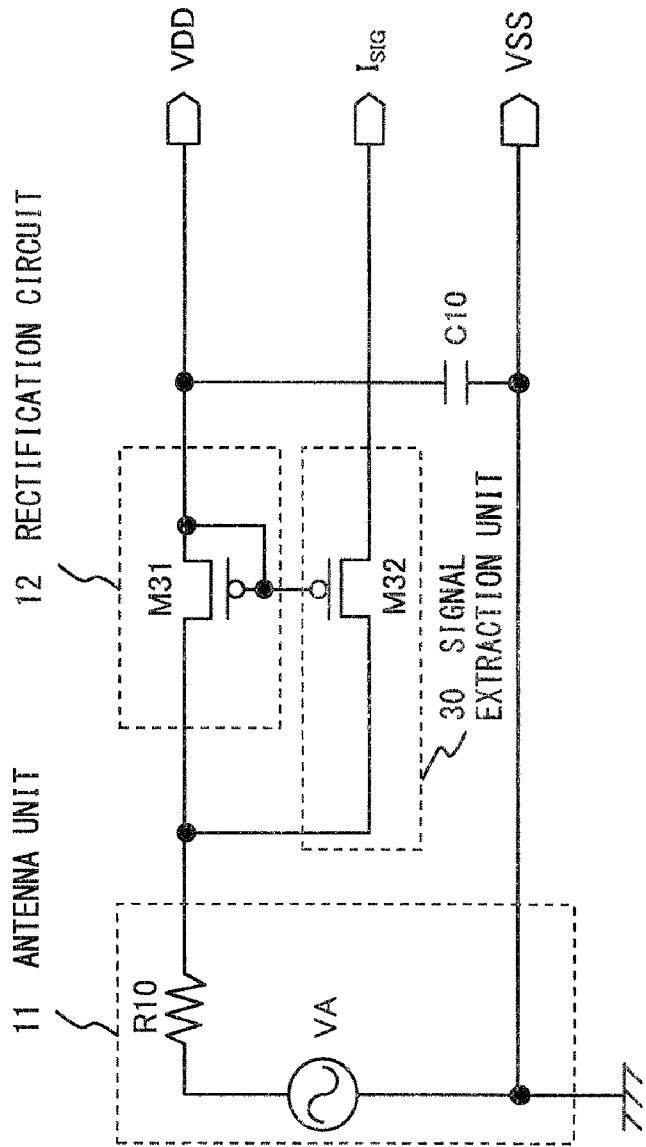
FIG. 7 is a diagram exemplifying the specific circuit configuration of a signal extraction circuit for extracting an information signal from the current flowing in the rectification circuit shown in FIG. 6.

Next is a description of FIG. 7 which exemplifies the specific circuit configuration of a signal extraction circuit for extracting an information signal from the current flowing in the rectification circuit 12.

Referring to FIG. 7, transistors M31 and M32 are p-MOS transistors. Here, the rectification circuit 12 comprises a transistor M31, and the signal extraction unit 30 comprises a transistor M32.

A radio frequency signal output from the antenna unit 11 is input to the source of the transistor M31. The gate of the transistor M31 is connected to the drain and the above described capacitor C10 is inserted between the connection point and a ground node. The transistor M31 performs a control in accordance with the change in radio frequency signal output from the antenna unit 11 as follows: during a period in which the voltage of the radio frequency signal applied to the source of the transistor M31 is higher than the voltage of the drain thereof, the conduction between the source and the drain is brought up to a turn-on state to let a current flow, while during a period in which the voltage of the radio frequency signal applied to the source is lower than the voltage of the drain, the conduction between the source and the drain is brought to a turn-off state to shut off the current therebetween.

The transistor M31 thusly performs a rectification by sending a radio frequency current between the drain and source thereof. The power supply signal component obtained by the rectification is charged in the capacitor C10 and output as a power supply VDD for the circuit at a later stage.

Meanwhile in the transistor M32, the gate is connected to the gate of the transistor M31. Here, the radio frequency signal output from the antenna unit 11 is input also to the source of the transistor M32. Therefore, when a current flows between the source and the drain of the transistor M31, the transistor M32 generates a current corresponding to the current and sends the current between the source and the drain of the transistor M32 per se. Thusly generated current is output from the drain of the transistor M32 as an extraction signal $I_{SIG}$. The change in magnitude of the extraction signal represents the original information signal. The original information signal is thusly extracted.

Figure 8:
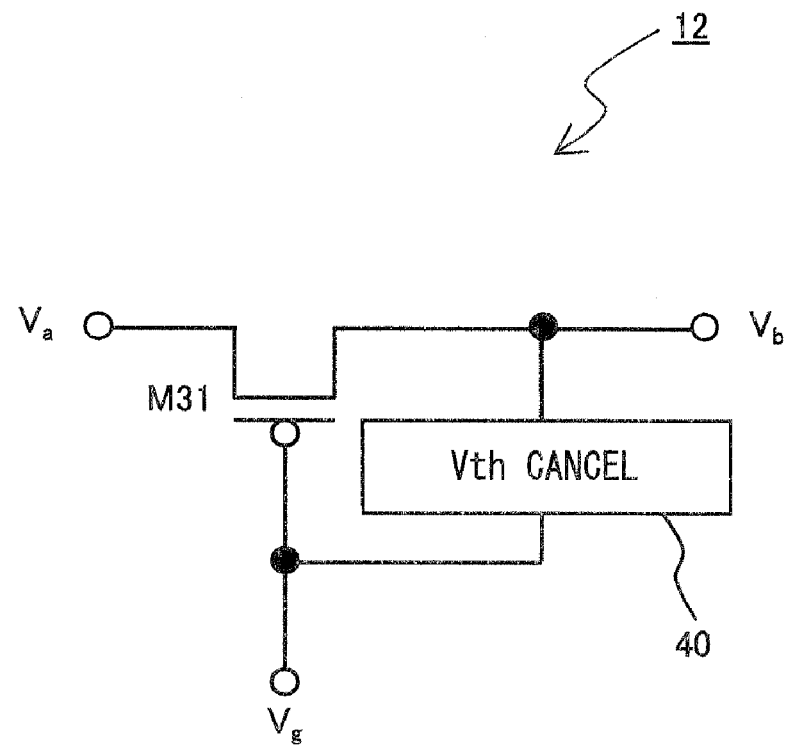
FIG. 8 is a diagram exemplifying another circuit configuration of the rectification circuit shown in FIG. 7.

Next is a description of FIG. 8 which exemplifies another circuit configuration of the rectification circuit 12 shown in FIG. 7. Also in the configuration of FIG. 8, a rectification is carried out by sending a radio frequency current between the drain and source of the transistor M31.

The difference between the configuration shown in FIG. 8 and the first circuit configuration example of the rectification circuit 12 of FIG. 7 lies where the gate and the drain of the transistor M31 are not directly connected together, and instead a Vth cancel circuit 40 is inserted therebetween, both in the former configuration.

Referring to FIG. 8, the sign Va is the voltage of a radio frequency signal input to the rectification circuit 12, and the Vb is the voltage of a post-rectification power supply signal component output from the rectification circuit 12. Further, the sign Vg is the gate voltage of the transistor M31 and a threshold voltage Vth1 is the minimum voltage across the gate and the source to bring up between the source and the drain to a turn-on state.

The Vth cancel circuit 40 generates a higher voltage Vthh, by a sufficiently small voltage ΔVt has compared to the threshold voltage Vth1, than a voltage which is lower by an amount equivalent to a threshold voltage Vth1 relative to the voltage Vb and outputs the voltage Vthh to the gate of the transistor M31.

The transistor M31 generally becomes a turn-on state if the gate voltage is lower than the source voltage by the threshold voltage Vth1 and a current flows between the source and the drain of the transistor M31.

Due to the function of the Vth cancel circuit 40, however, a higher voltage Vthh, by a voltage ΔVth, than a voltage which is lower than the voltage Vb by the threshold voltage Vth1 is input to the gate of the transistor M31 shown in FIG. 8. Therefore, when the voltage Va increases by the voltage ΔVth relative to the voltage Vb, the transistor M31 becomes a turn-on state. That is, if the voltage Va increases relative to the voltage Vb by the voltage ΔVth or more, a voltage more than the voltage Va by the threshold voltage Vth1 or less is applied to the gate of the transistor M31 and therefore the transistor M11 becomes a turn-on state.

In contrast, if the voltage Va is lower than the voltage Vb, a higher voltage Vthh, by the voltage ΔVth, than a voltage which is lower than the voltage Vb by the threshold voltage Vth1 is input to the gate of the transistor M31 due to the function of the Vth cancel circuit 40 and therefore the transistor M11 becomes a turn-off state and thereby a current never flows between the source and the drain.

As described above, the Vth cancel circuit 40 inputs, to the gate of the transistor M31, a higher voltage (i.e., a higher voltage, by the voltage ΔVth, than a voltage which is lower by the threshold voltage Vth1) Vthh by the voltage nearby the threshold voltage Vth1 than the voltage on the drain side (i.e., on the rectification output side) of the transistor M31. By so doing, the minimum difference between the voltages Va and Vb for bringing up the rectification circuit 12 (shown in FIG. 8) to a turn-on state is reduced to a voltage ΔVth. That is, a voltage across the drain and source of the transistor M31 required to bring up the rectification circuit 12 to a turn-on state can be decreased as compared to the case of not using the Vth cancel circuit 40 (i.e., a threshold voltage Vth1 or more is required).

Figure 9:
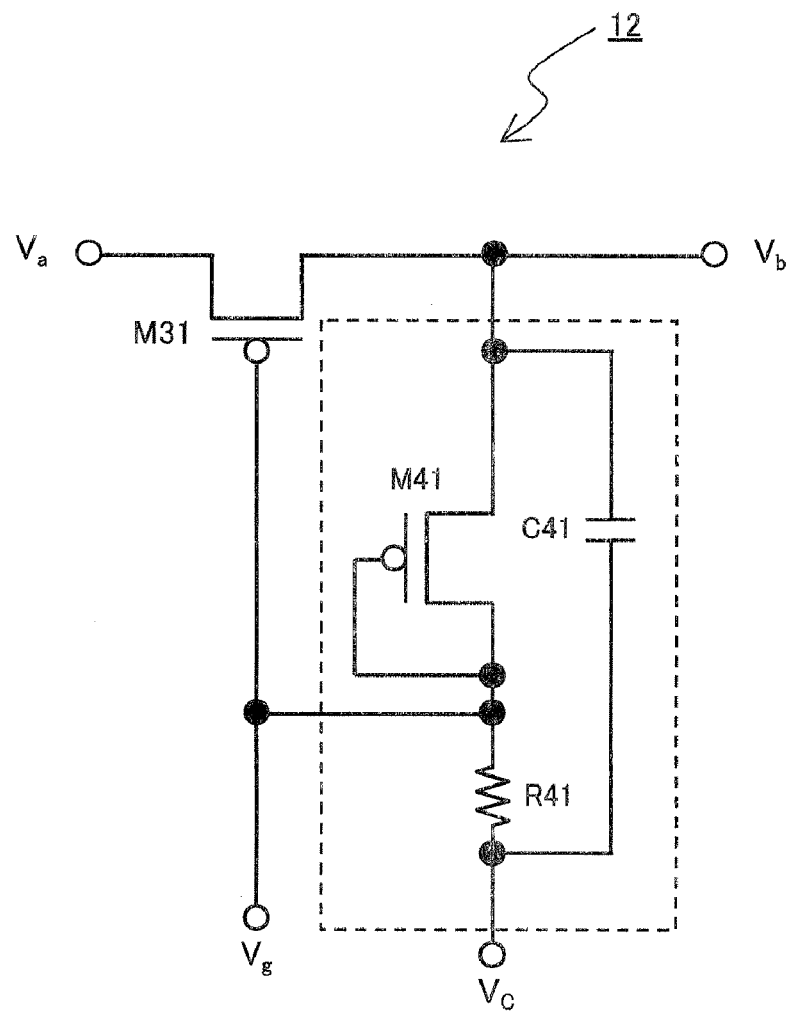
FIG. 9 is a diagram exemplifying the specific circuit configuration of the Vth cancel circuit shown in FIG. 8.

Next is a description of FIG. 9 which exemplifies the specific circuit configuration of the Vth cancel circuit 40 cancelling the threshold voltage Vth of the transistor M31 in the manner as described above.

In the configuration of FIG. 9, the Vth cancel circuit 40 comprises a transistor M41 (that is a p-MOS transistor), a resistor R41 and a capacitor C41.

The gate and the drain of the transistor M41 and one terminal of the resistor R41 are connected together, and the connection point is connected to the gate of the transistor M31. The other terminal of the resistor R41 and one terminal of the capacitor C41 are connected together and the voltage Vb shown in FIG. 8 is applied to the other terminal of the capacitor C41 and the source of the transistor M41.

Referring to FIG. 9, the threshold voltage of the transistor M41 is defined as Vth2. Here, the transistor M41 is configured such that the threshold voltage Vth2 is lower than the threshold voltage Vth1 of the transistor M31 by a voltage ΔVth. The voltage difference ΔVth may be small and therefore, when forming, for example, the transistors M31 and M41 on the same semiconductor substrate, such a voltage difference ΔVth can be obtained by configuring the gate length or gate width a little differently between the transistors M31 and M41.

A sufficiently lower voltage Vc (e.g., an electric potential VSS of a ground node) than the voltage Vb so as to maintain the transistor in a turn-on state is applied to the connection point between the resistor R41 and capacitor C41. Note that the capacitor C41 is equipped for preventing a rapid change in the voltage difference between the voltages Vb and Vc.

Since the gate and the drain of the transistor M41 are connected together, a current flows in the resistor R11 through the source and the drain of the transistor M41. In this event, the voltage at the drain of the transistor M41 is lower than the voltage at the source (i.e., the voltage Vb) of the transistor M41 by the voltage Vth2. Here, the gate of the transistor M31 is connected to the drain of the transistor M41 and therefore the gate voltage Vg of the transistor M31 is lower than the voltage Vb by the voltage Vth2, that is, the voltage Vg is a higher voltage Vthh, by the voltage ΔVth, than a voltage which is lower than a voltage at the drain of the transistor M31 by the threshold voltage Vth1. Therefore, the minimum difference between the voltages Va and Vb for bringing up the transistor M31 to a turn-on state is reduced to a voltage ΔVth.

Note that, when the rectification circuit 12 shown in FIG. 9 is applied to the signal extraction circuit of FIG. 7, the configuration is such as to make the gate voltages of the transistors M31 and M32 identical by connecting the gates of both transistors together.

Next is a description of the characteristic of the rectification circuit 12 shown in FIG. 8.

Figure 10:
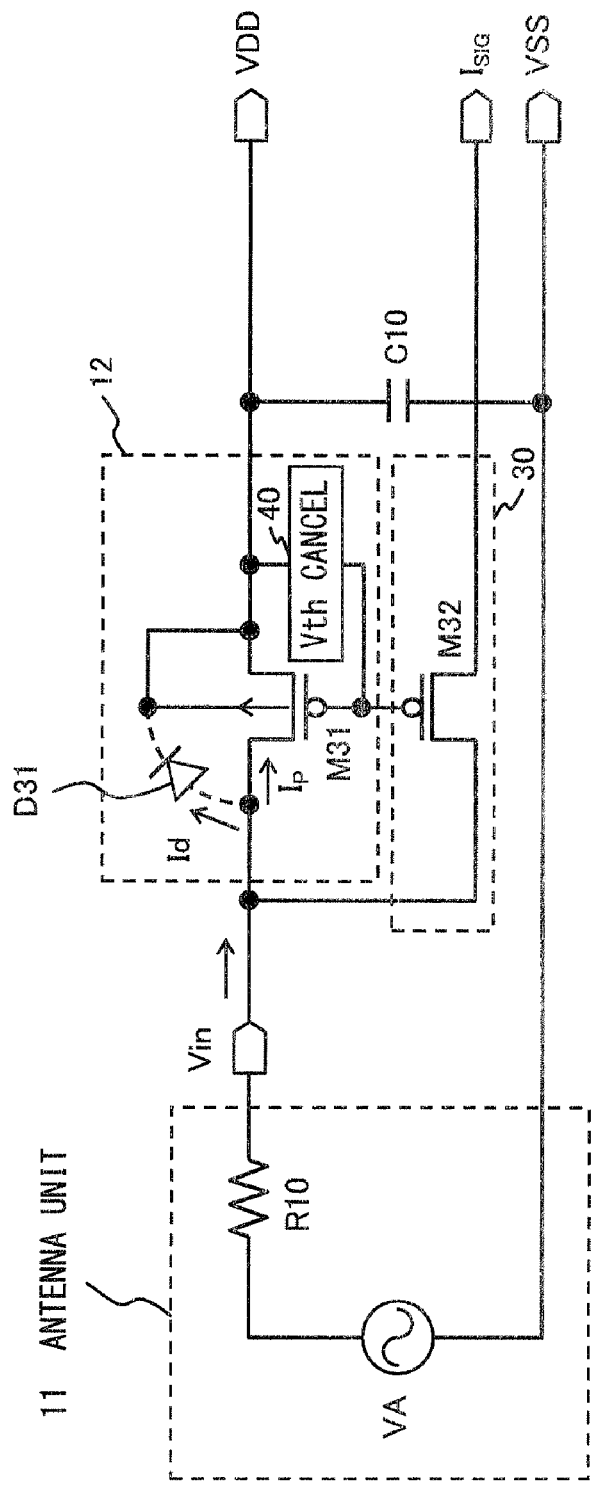
FIG. 10 is a diagram showing a circuit configuration in which the rectification circuit shown in FIG. 8 is applied to the signal extraction circuit of FIG. 7.

FIG. 10 shows the circuit configuration in which the rectification circuit 12 shown in FIG. 8 is applied to the signal extraction circuit of FIG. 7. Here, a parasitic diode D31 existing between the source and the drain of the transistor M31 is focused.

Figure 11:
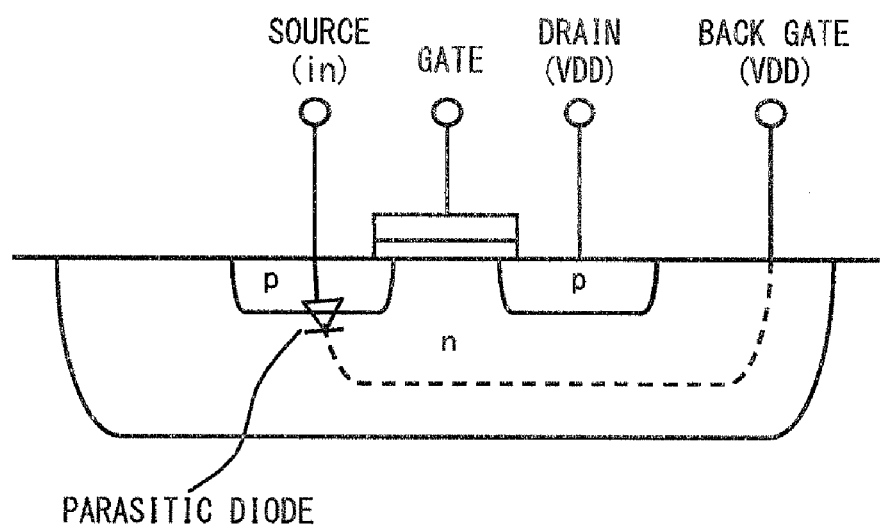
FIG. 11 is a diagram showing the configuration of a common P-channel metal oxide semiconductor (p-MOS) transistor.

FIG. 11 shows the configuration of a common p-MOS transistor. In the configuration of a common MOS transistor, a parasitic diode is formed between the source and the drain (i.e., a back-gate) as shown in FIG. 11.

Referring to FIG. 10, what is extracted by the transistor M32 as an extraction signal $I_{SIG}$, of the current flowing between the source and the drain of the transistor M31, is only a current corresponding to the current Ip flowing appropriately between the source and the drain under the control of the gate voltage of the transistor M31 and therefore the current Id flowing in the parasitic diode D31 does not contribute to the extraction of an extraction signal $I_{SIG}$. Accordingly, a reduction of the current Id so as to increase the flow of the current Ip makes it possible to extract the extraction signal $I_{SIG}$ more effectively.

In this context, the Vth cancel circuit 40 is capable of minimizing the voltage difference between the source and the drain of the transistor M31 required for a current to flow between the source and the drain thereof. Here, the voltage difference becoming small means that the voltage difference between the anode and cathode of the parasitic diode D31 is minimized, and the fact accordingly brings forth the effect in decreasing the current Id flowing in the parasitic diode D31.

Figure 12A:
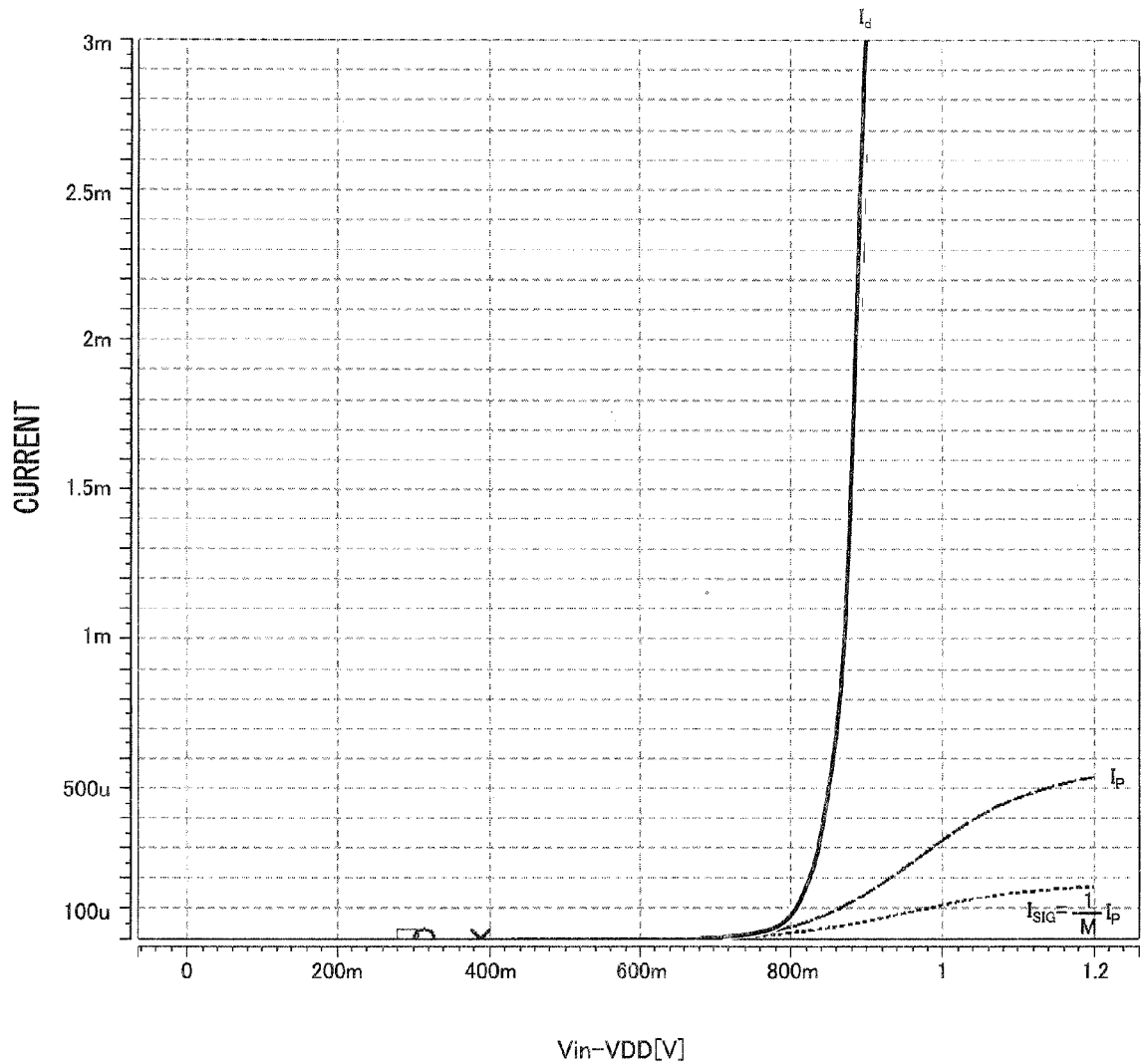
FIG. 12A is a diagram describing the effect of a Vth cancel circuit used in the circuit shown in FIG. 10 (part 1)
Figure 12B:
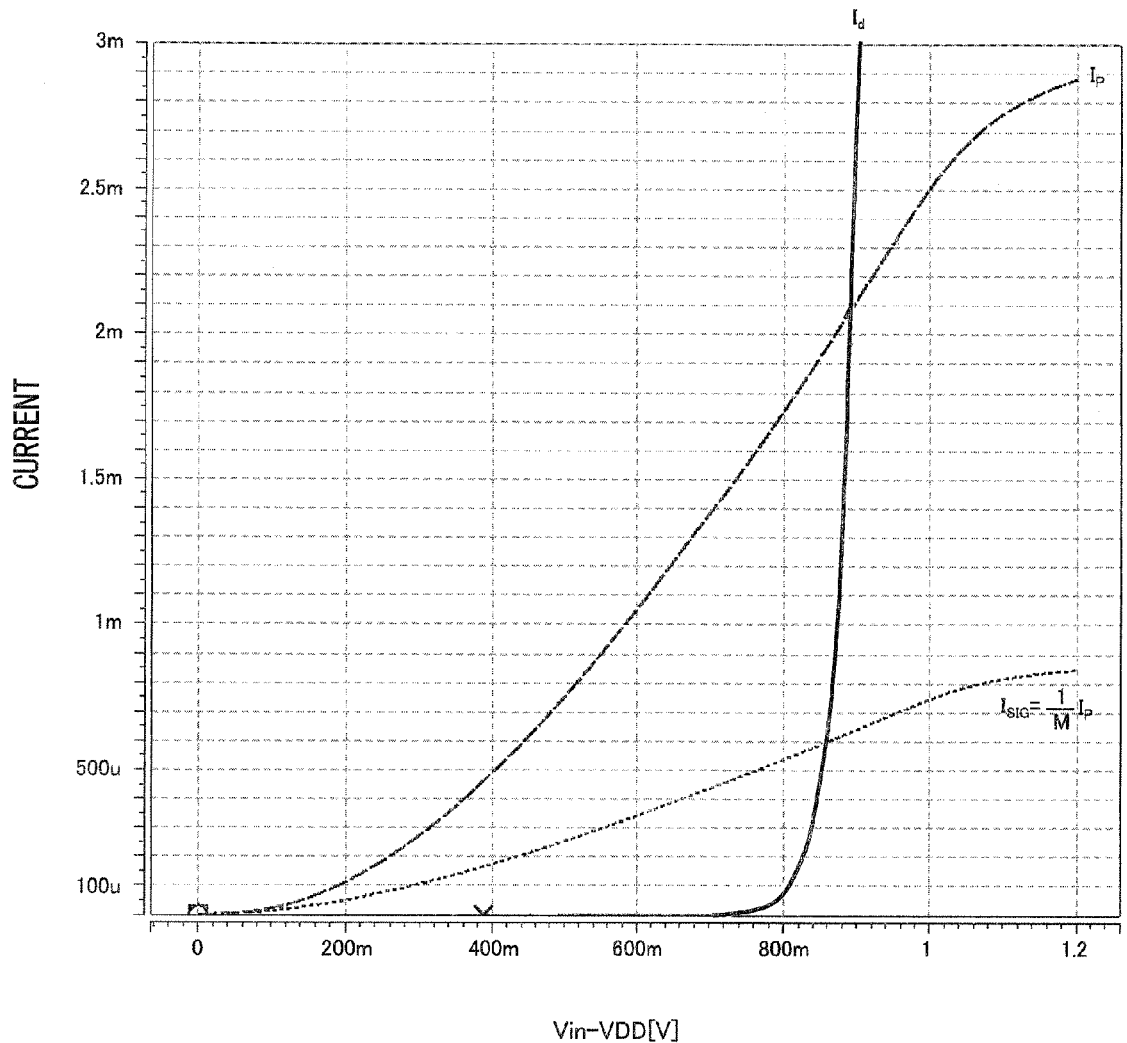
FIG. 12B is a diagram describing the effect of a Vth cancel circuit used in the circuit shown in FIG. 10 (part 2)

Next is a description of the effect of the Vth cancel circuit 40 in the circuit shown in FIG. 10 by referring to FIGS. 12A and 12B. Note that FIG. 12A is a diagram showing the voltage—current characteristic by a graph in the case of the Vth cancel circuit 40 not existing, and FIG. 12B is a diagram showing the voltage—current characteristic by a graph in the case of the Vth cancel circuit 40 existing.

Referring to FIGS. 12A and 12B, the horizontal axis indicates the voltage difference between the source and the drain of the transistor M31 in either drawing, and the vertical axis indicates the current values in either drawing. Note that the mirror ratio of the transistor M32 to transistor M31 is set at 1/M.

Comparing the graph of FIG. 12B with that of FIG. 12A, it is comprehensible that the extraction signal $I_{SIG}$ is extracted as a result of the current Ip flowing in a very small range in which the voltage difference between the source and the drain of the transistor M31 and in which the current Id flowing the parasitic diode D31 is extremely small when the Vth cancel circuit 40 exists.

As such, the rectification circuit 12 shown in FIG. 8 has a possibility of being capable of extracting an extraction signal $I_{SIG}$ under the condition, in which the voltage of a radio frequency signal output from the antenna unit 11, as compared to the configuration shown in FIG. 7.

Next is a description of the comparable advantage between the configuration of the first example of the signal extraction circuit shown in FIG. 3, that is, the configuration for the signal extraction unit 14 to extract the original information signal from the bypass current sent by the shunt regulator 13 for performing a control for stabilizing, at a prescribed voltage value, the voltage output from the rectification circuit 12 and the configuration of the second example shown in FIG. 6, that is, the configuration for the signal extraction unit 30 to extract the original information signal from the current flowing in the rectification circuit 12 rectifying the radio frequency signal output from the antenna unit 11.

Figure 13:
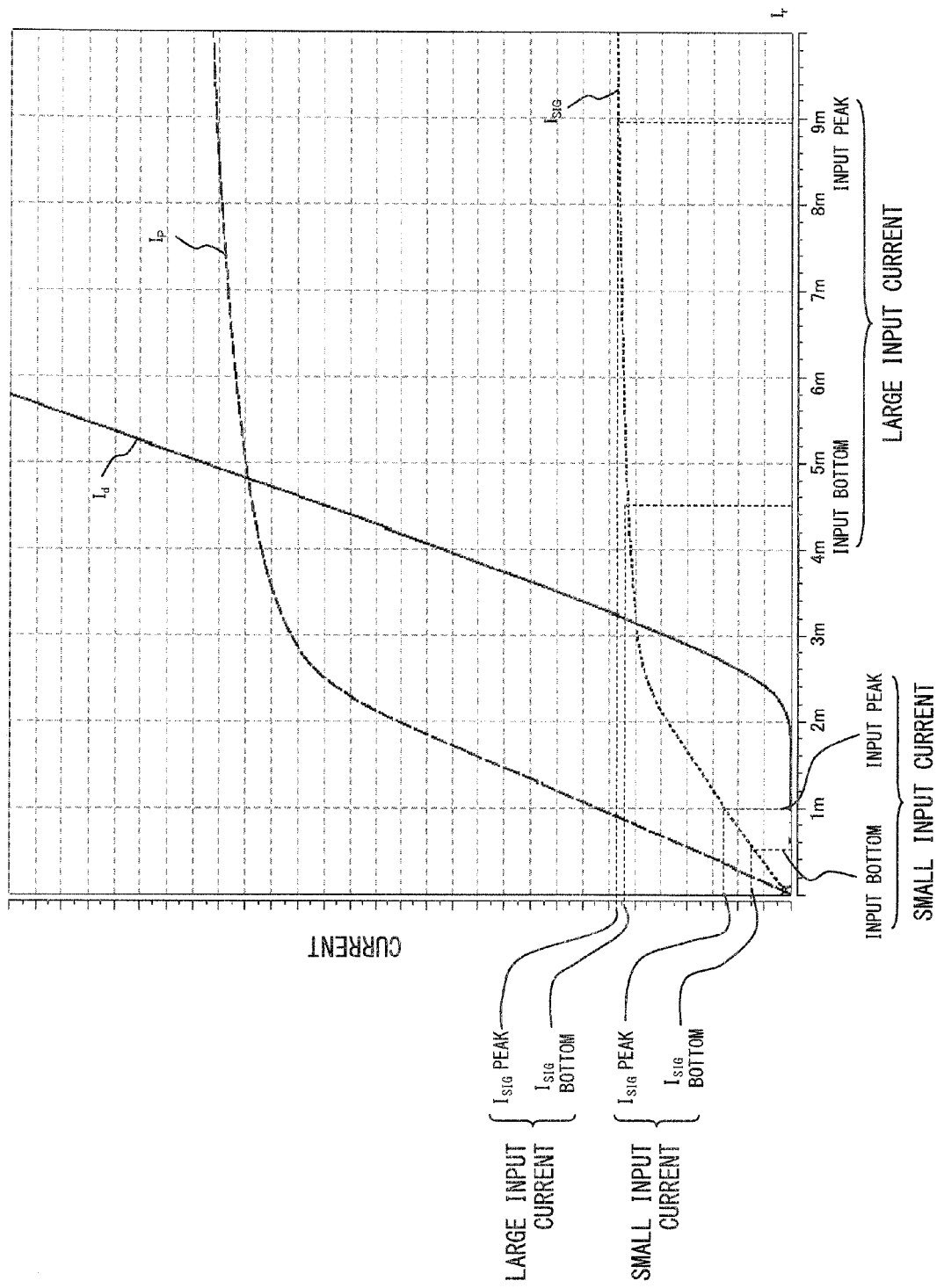
FIG. 13 is a diagram showing a simulation result of the input and output characteristics of the rectification circuit and signal extraction unit both in the configuration shown in FIG. 6.

First is a description of FIG. 13 which is a graph showing a simulation result of the input and output characteristics of the rectification circuit 12 and signal extraction unit 30 both in the second example shown in FIG. 6. Note that the specific circuit configurations of the rectification circuit 12 and signal extraction unit 30 in the configuration of FIG. 6 use the same as those used for the configuration of FIG. 10.

Referring to FIG. 13, the horizontal axis indicates the current values Ir of a radio frequency signal output from the antenna 11, and the vertical axis indicates the respective current values of the currents Id and Ip and extraction signal $I_{SIG}$.

In FIG. 13, the first focus is the correspondence between (A) and (B), where (A) is the maximum value (i.e., the input peak current) and minimum value (i.e., the input bottom current) of an input current and (B) is the maximum value (i.e., the $I_{SIG}$ peak current) and minimum value (i.e., the $I_{SIG}$ bottom current) of an extraction signal $I_{SIG}$, in the case of the current value Ir being relatively small As such, when the current value Ir is relatively small, the current Id is sufficiently small and therefore the change in magnitude of the current Ip in accordance with the change in magnitude of the current value Ir is significant Accordingly the change in magnitude of an extraction signal $I_{SIG}$ is also clear and therefore the signal data can be appropriately generated by the demodulation circuit 15.

The next focus in FIG. 13 is the correspondence between (A) and (B), where (A) is the maximum value (i.e., the input peak current) and minimum value (i.e., the input bottom current) of an input current and (B) is the maximum value (i.e., the $I_{SIG}$ peak current) and minimum value (i.e., the $I_{SIG}$ bottom current) of an extraction signal $I_{SIG}$, in the case of the current value Ir being large in excess of a predefined value. As such, as the current value Ir increases, the most of the increased amount of the current value Ir flows as a current Id, making the change in magnitude of the current value Ir unclear in the change in magnitude of the current Ip. This in turn causes the change in magnitude of an extraction signal $I_{SIG}$ also to be unclear, making it difficult for the demodulation circuit 15 to generate signal data.

That is, if the emission power of an electromagnetic wave emitted from a reader/writer apparatus is high and/or if the distance between a reader/writer apparatus and an antenna unit 11 is short, increasing the current value of a radio frequency signal output from the antenna unit 11, the configuration shown in FIG. 6 makes it difficult to extract the change in the current value as an extraction signal $I_{SIG}$. If the current value of a radio frequency signal output from the antenna unit 11 is small, assuming, for example, a modulation ratio of the present radio frequency signal (i.e., {(peak current)−(bottom current)}/(peak current)) is 0.5, the modulation ratio of the extraction signal $I_{SIG}$ is also 0.5. If the current value of a radio frequency signal output from the antenna unit 11 is large, however, the modulation ratio of the extracted extraction signal $I_{SIG}$ is sometimes reduced to about 0.06 even if the antenna unit 11 outputs a radio frequency signal of which the modulation is, for example, 0.5.

Here, as an example, there is the method for increasing the mutual conductance of the transistor M31 by making the size of a MOS transistor constituting the transistor M31 large, thereby preventing the parasitic diode D31 from being turned on even if a large current flows in the transistor M31. The method, however, cannot be used when using a radio frequency signal, as a carrier wave, of a very high frequency such as in the UHF band, because the parasitic capacitance of the transistor M31 becomes extremely large.

In contrast, the configuration of the first example of the signal extraction circuit shown in FIG. 3, that is, the configuration for the signal extraction unit 14 extracting the original information signal from the bypass current sent by the shunt regulator 13 for performing a control for stabilizing, at a prescribed voltage value, the voltage output from the rectification circuit 12 is capable of extracting an extraction signal $I_{SIG}$ regardless of whether the current signal output from the rectification circuit 12 is the current Ip rectified by the transistor M31 or the current Id rectified by the parasitic diode D31. If, however, the current signal output from the rectification circuit 12 is small, that is, if the current value of a radio frequency signal output from the antenna unit 11 is small, reducing the bypass current sent by the shunt regulator 13, the configuration of FIG. 3 makes it difficult for the demodulation circuit 15 to generate signal data because the change in magnitude of the extraction signal $I_{SIG}$ extracted by the signal extraction unit 14 becomes unclear.

Figure 14:
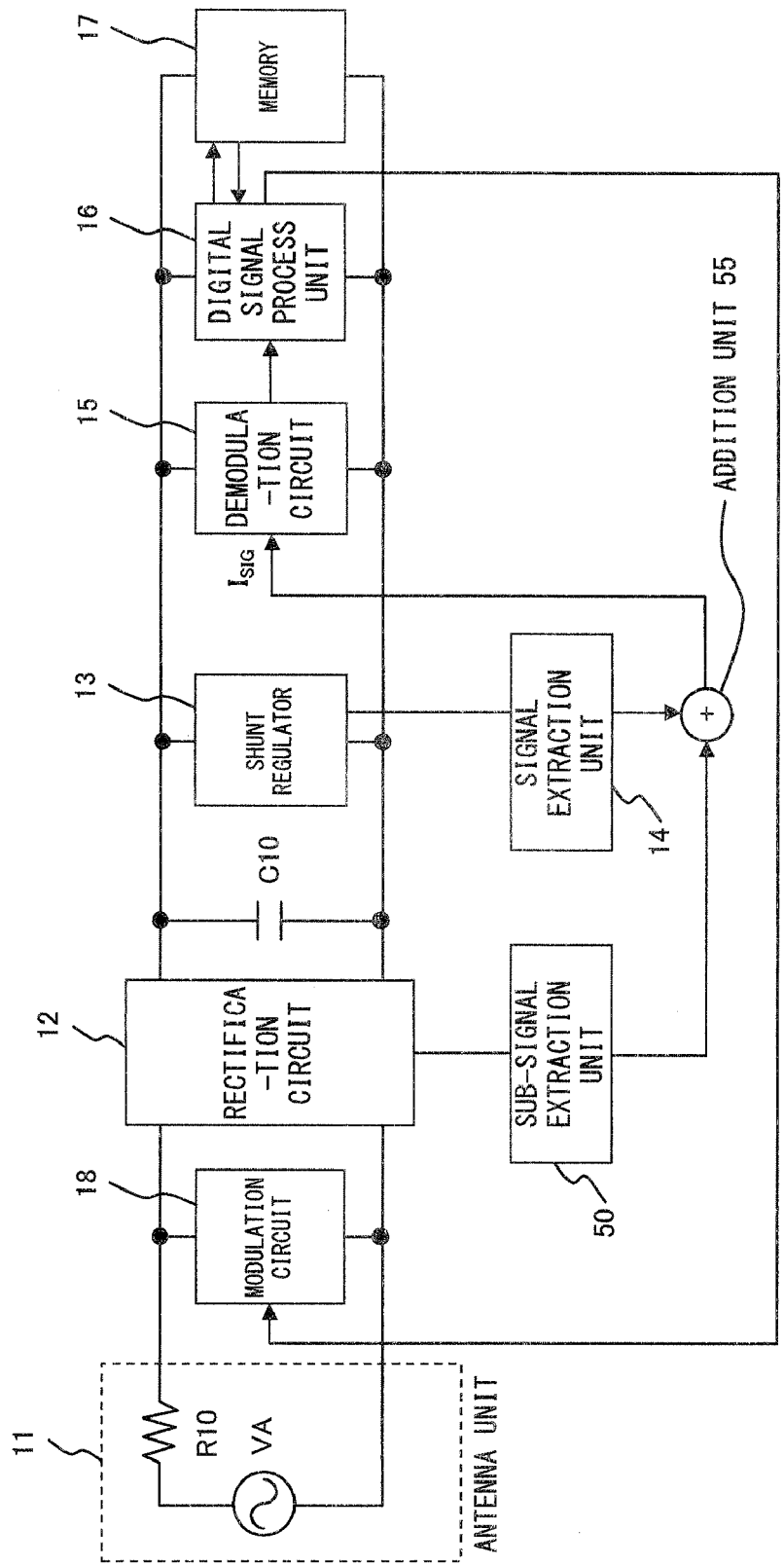
FIG. 14 is a block diagram showing a third example of the configuration of an RFID tag.

Next is a description of FIG. 14 which is a block diagram showing a third example of the configuration of an RFID tag which is a noncontact data carrier.

In the configuration of FIG. 14, the antenna unit 11, rectification circuit 12, capacitor C10, shunt regulator 13, signal extraction unit 14, demodulation circuit 15, digital signal process unit 16, memory 17 and modulation circuit 18 are similar to those comprised in the first example of the configuration of the RFID tag shown in FIG. 3.

The configuration of the third example shown in FIG. 14 differs from that of the first example shown in FIG. 3 in adding a sub-signal extraction unit 50 for extracting the original information signal from a current flowing in the rectification circuit 12 rectifying a radio frequency signal output from the antenna unit 11 and an addition unit 55 for adding a signal extracted by the sub-signal extraction unit 50 and that extracted by the signal extraction unit 14, and in sending the result of adding by the addition unit 55 to the demodulation circuit 15 as an extraction signal $I_{SIG}$.

Here, the sub-signal extraction unit 50 is similar to the signal extraction unit 30 comprised in the second example shown in FIG. 6. That is, the demodulation circuit 15 generates signal data from the extraction signal $I_{SIG}$ as a result of adding a signal extracted from the current flowing in the rectification circuit 12 and a signal extracted from the bypass current sent by the shunt regulator 13. This configuration makes it possible to obtain an extraction signal $I_{SIG}$ of a clear change in magnitude regardless of the magnitude of the current value of a radio frequency signal output from the antenna unit 11 and therefore expands the range of the current value of the present radio frequency signal allowing the demodulation circuit 15 to generate signal data appropriately.

Note that the noncontact IC card embodying the present invention can also be configured in a similar manner to that shown in FIG. 14.

Figure 15:
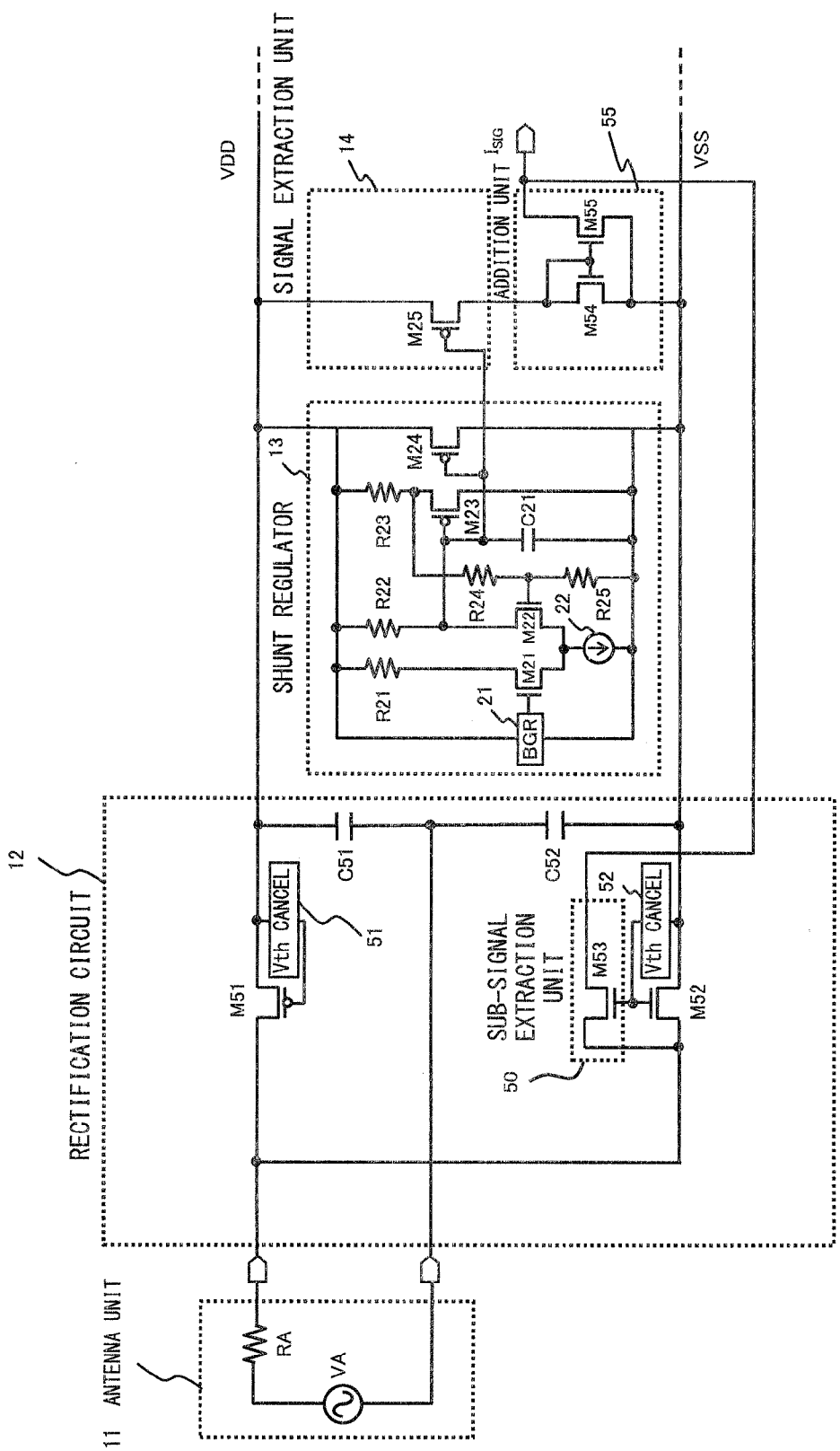
FIG. 15 is a diagram exemplifying the specific circuit configuration of the signal extraction circuit used in the configuration of FIG. 14.

Next is a description of FIG. 15 which exemplifies the specific circuit configuration of the signal extraction circuit used in the configuration of FIG. 14, exemplifying the circuit configurations of the rectification circuit 12, capacitor C10, shunt regulator 13, signal extraction unit 14, sub-signal extraction unit 50 and addition unit 55.

Referring to FIG. 15, the circuit configurations of the shunt regulator 13 and signal extraction unit 14 are the same as those used for the configuration of FIG. 5 and therefore the description is not provided here.

The rectification circuit 12 comprises transistors M51, M52 and M53, Vth cancel circuits 51 and 52, and capacitors C51 and C52. Note that the capacitors C51 and C52 correspond to the capacitor C10 shown in FIG. 14.

The Vth cancel circuit 51 is for cancelling the threshold voltage Vth of the transistor M51 which is a p-MOS transistor. Here, the connection between the transistor M51 and Vth cancel circuit 51 is the same as shown in FIG. 8, with the operation being the same as that of the circuit shown in FIG. 8. Therefore, the transistor M51 performs a rectification by sending a radio frequency current between the source and the drain thereof. A power supply signal component obtained by the rectification is charged in the capacitor C51.

Meanwhile, the Vth cancel circuit 52 is for cancelling the threshold voltage Vth of the transistor M52 which is an n-MOS transistor. That is, the Vth cancel circuit 52 inputs, to the gate of the transistor M52, a higher voltage (i.e., a higher voltage, by the voltage ΔVth, than a voltage which is lower by the threshold voltage Vth1) Vthh by the voltage nearby the threshold voltage Vth1 than the voltage on the drain side (i.e., on the rectification output side) of the transistor M52. By so doing, the minimum voltage difference between the drain and source for bringing up the transistor M52 to a turn-on state is reduced to a voltage ΔVth.

The radio frequency signal output from the antenna unit 11 is input to the source of the transistor M52.

The transistor M52 performs a control in accordance with the change in radio frequency signal output from the antenna unit 11 as follows: during a period in which the voltage of the present radio frequency signal applied to the source of the transistor M52 is lower than the voltage of the drain thereof, the conduction between the source and the drain is brought up to a turn-on state to let a current flow, while during a period in which the voltage of the present radio frequency signal applied to the present source is higher than the voltage of the present drain, the conduction between the source and the drain is brought to a turn-off state to shut off the current therebetween.

The transistor M52 performs a rectification thusly by sending a radio frequency current between the source and the drain thereof. The power supply signal component obtained by the rectification is charged in the capacitor C52.

As described above, in the rectification circuit 12, the transistor M51 becomes a turn-on state to charge the capacitor C51 if the voltage of the radio frequency signal applied to the respective sources of the transistors M51 and M52 is positive, and the transistor M52 becomes a turn-on state to charge the capacitor C52 if the voltage of the present radio frequency signal is negative. Then, a power supply signal component is supplied to the circuit at later stage from either end of the capacitors C51 and C52 which are serially connected together. That is, the rectification circuit 12 shown in FIG. 15 constitutes a voltage-doubler rectifier so as to be capable of applying about two times the voltage of the rectification circuit 12 to a circuit at later stage.

Meanwhile, the transistor M53 constituting the sub-signal extraction unit 50 is an n-MOS transistor of which the gate is connected to the gate of the transistor M52. Here, a radio frequency signal output from the antenna unit 11 is also input to the source of the transistor M53. Therefore, when a current flows between the source and the drain of the transistor M52, the transistor M53 generates a current corresponding to the current value and sends the current between the source and the drain of the transistor M53 per se. Thusly generated current is output from the drain of the transistor M53. Note that the change in magnitude of the current represents the original information signal.

The addition unit 55 comprises transistors M54 and M55 which are n-MOS transistors. Here, the respective gates of the transistors M54 and M55 are connected to the drain of the transistor M54, and the respective sources of the transistors M54 and M55 are connected to a ground node. That is, the transistors M54 and M55 form a current mirror.

As described before, the current flowing from the transistor M25 is a signal extracted by the signal extraction unit 14. The current flows between the drain and source of the transistor M54 and therefore the transistor M55 generates a current corresponding to the current value and sends it between the source and the drain of the transistor M55 per se. Here, the drain of the transistor M55 is connected to the drain of the transistor M53 which is the sub-signal extraction unit 50, and an extraction signal $I_{SIG}$ is extracted from the connection point. Therefore, the extraction signal $I_{SIG}$ is actually the result of adding (C) and (D), where (C) is the current flowing between the drain and source of the transistor M55, that is, the signal extracted by the signal extraction unit 14, and (D) is the current flowing between the drain and source of the transistor M53 that is, the signal extracted by the sub-signal extraction unit 50.

Note that the rectification circuit 12 comprised in the configuration of FIG. 14 may adopt various circuit configurations such as the configuration as shown in FIG. 7, in lieu of being limited to a voltage-doubler rectification circuit.

Figure 16:
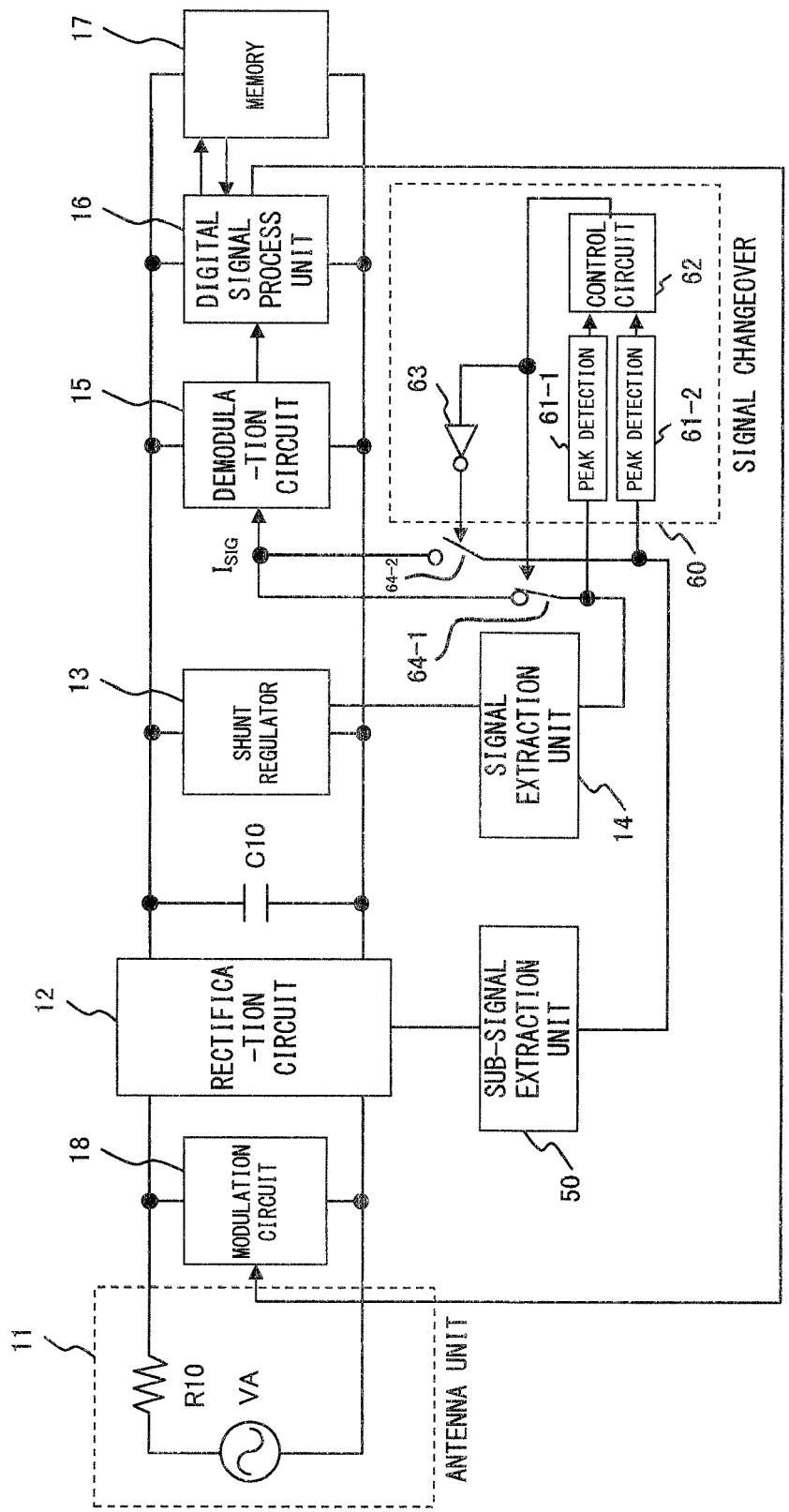
FIG. 16 is a block diagram showing a fourth example of the configuration of an RFID tag.

Next is a description of FIG. 16 which is a block diagram showing a fourth example of the configuration of an RFID tag which is a noncontact data carrier.

In the configuration of FIG. 16, the antenna unit 11, rectification circuit 12, capacitor C10, shunt regulator 13, signal extraction unit 14, demodulation circuit 15, digital signal process unit 16, memory 17 and modulation circuit 18 are similar to those comprised in the first example of the configuration of the RFID tag shown in FIG. 3. The sub-signal extraction unit 50 comprised in FIG. 16 is similar to that comprised in the third example of the configuration of the RFID tag shown in FIG. 14.

The configuration of the fourth example shown in FIG. 16 differs from that of the third example shown in FIG. 14 in deleting the addition unit 55 and, instead, equipping a signal changeover control unit 60 and switches 64-1 and 64-2 as a selection unit for selecting either one of the information signal extracted by the signal extraction unit 14 and the information signal extracted by the sub-signal extraction unit 50.

Referring to FIG. 16, the signal changeover control unit 60 comprises peak detection units 61-1 and 61-2, a control circuit 62 and an inverter 63.

The peak detection unit 61-1 detects the peak (i.e., the maximum value) of the signal extracted by the signal extraction unit 14, and the peak detection unit 61-2 detects the peak (i.e., the maximum value) of the signal extracted by the sub-signal extraction unit 50.

The control circuit 62 performs a control for selecting a larger one of the detected two peaks. With this control, a signal is selected if the current value of a radio frequency signal output from the antenna unit 11 is large so that the signal extracted by the signal extraction unit 14 from the bypass current sent by the shunt regulator 13 is sufficiently large, while a signal extracted by the sub-signal extraction unit 50 from the current flowing in the rectification circuit 12 is selected if the current value of the radio frequency signal output from the antenna 11 is small so that the signal extracted by the signal extraction unit 14 from the bypass current sent by the shunt regulator 13 is small.

The switch 64-1 opens or closes the line leading the signal extracted by the signal extraction unit 14 to the demodulation circuit 15, and the switch 64-2 opens or closes the line leading the signal extracted by the sub-signal extraction unit 50 to the demodulation circuit 15. The open/close controls of the switches 64-1 and 64-2 are performed on the basis of the control signal indicating the selection result of the control circuit 62, with the control signal for the switch 64-2 is inverted for its logic by the inverter 63. Therefore, of the switches 64-1 and 64-2, if one is in short circuit, the other is always open.

As such, the signal changeover control unit 60 compares the magnitude of the information signal extracted by the signal extraction unit 14 and that of the information signal extracted by the sub-signal extraction unit 50, selects one information signal on the basis of the comparison result and controls the switches 64-1 and 64-2 on the basis of the selection result. This results in sending the information signal selected by the signal changeover control unit 60 to the demodulation circuit 15 as the extraction signal $I_{SIG}$. This configuration enables the demodulation circuit 15 to generate signal data on the basis of the information signal extracted by the signal extraction unit 14 if the current value of a radio frequency signal output from the antenna unit 11 is large, and enables the demodulation circuit 15 to generate signal data on the basis of the information signal extracted by the sub-signal extraction unit 50 if the current value of the radio frequency signal output from the antenna unit 11 is small. That is, the information signal of the change in magnitude being clear is obtained regardless of the magnitude of the current value of a radio frequency signal, thereby enabling the demodulation circuit 15 to generate signal data appropriately regardless of the magnitude of the current value of the radio frequency signal.

Note that a noncontact IC card embodying the present invention can be configured in a similar manner to that shown in FIG. 16.

While the preferred embodiments of the present invention has been described, the present invention can be variously improved and/or changed within the scope of the present invention, in lieu of it being limited to the individual embodiments described above.

As an example, the above described embodiments use MOS transistors (i.e., MOSFET) as individual transistors; instead, it is also possible to configure the demodulation circuit 15 by using a metal semiconductor (MES) FET, a metal insulator semiconductor (MIS) FET or a bipolar transistor.

According to the above described embodiments, the original information signal is extracted from the bypass current sent by the shunt regulator for stabilizing the power supply voltage at a predetermined voltage value and therefore the information signal can be extracted without influencing the stabilization of the power supply voltage.

Note that the signal extraction circuit according to the above described embodiments may be configured such that the signal extraction unit generates a current corresponding to the value of the current of the bypass current and outputs the generated current as the information signal.

In this case, the shunt regulator may comprise a bypass transistor for controlling the bypass current, wherein the signal extraction unit outputs a current sent by a transistor, of which the same voltage as the gate voltage of the bypass transistor is applied to the gate, as the information signal.

The above noted configurations make it possible to extract an information signal without influencing the bypass current.

Further, the signal extraction circuit according to the above described embodiments may be configured such that the shunt regulator performs the control by sending the bypass current between the drain and the source of a transistor of which the gate voltage is set at a voltage obtained by dividing the voltage, obtained by rectifying the radio frequency signal, by a resistor.

Such configured shunt regulator makes it possible to control a voltage, which is obtained by rectifying a radio frequency signal, so as to stabilize at a prescribed voltage.

Further, the signal extraction circuit according to the above described embodiments may be configured such that the shunt regulator performs the control by sending the bypass current between the drain and source of a transistor in which the gate voltage is set at a prescribed reference voltage.

Such configured shunt regulator makes it possible to control a voltage, which is obtained by rectifying a radio frequency signal, so as to stabilize at a prescribed voltage.

In this case, the configuration may be such that the value of the reference voltage is set on the basis of the prescribed voltage and of a threshold voltage for turning on the transistor.

This configuration reduces the variation in the threshold voltage Vth of the transistor influencing the operation of the transistor per se.

Further, the signal extraction circuit according to the above described embodiments may further comprise a sub-signal extraction unit for extracting the information signal from a current flowing in a rectification circuit rectifying the radio frequency signal, and an addition unit for adding an information signal extracted by the signal extraction unit and an information signal extracted by the sub-signal extraction unit.

This configuration makes it possible to obtain an information signal of which the change in magnitude is clear regardless of the amount of the current value of a radio frequency signal.

Further, the signal extraction circuit according to the above described embodiments may further comprise a sub-signal extraction unit for extracting the information signal from a current flowing in a rectification circuit rectifying the radio frequency signal, and a selection unit for selecting either of the information signal extracted by the signal extraction unit and the information signal extracted by the sub-signal extraction unit.

This configuration also makes it possible to obtain an information signal of which the change in magnitude is clear regardless of the amount of the current value of a radio frequency signal.

In this case, the configuration may be such that the selection unit performs the selection on the basis of the result of comparing between the magnitude of the information signal extracted by the signal extraction unit and that of the information signal extracted by the sub-signal extraction unit.

Thusly configured selection unit makes it possible to select either one of the information signal extracted by the signal extraction unit and that extracted by the sub-signal extraction unit.

In this case, the configuration may be such that the rectification circuit performs the rectification by sending the radio frequency signal between the drain and source of a transistor, and a voltage which is higher, by the voltage nearby a threshold voltage for turning on the transistor, than the voltage at the rectification output of the transistor is applied to the gate of the transistor.

This configuration makes it possible to reduce a voltage between the drain and source, which is required to turn on between the drain and source of the transistor.

Note that the RFID tag and noncontact IC card which are equipped with the above described signal extraction circuit according to the above described embodiments are also included in the scope thereof.

The above described embodiments are contrived so as to bring forth the benefit of achieving both the obtainment of a stable power supply voltage and the extraction of an information signal, both from a radio frequency signal which is modified by using the information signal and in which the amplitude dynamically changes.

What is claimed is:

1. A signal extraction circuit for extracting an information signal from a radio frequency signal including the information signal comprising:
    a shunt regulator for performing a control so as to stabilize a voltage obtained by rectifying the radio frequency signal at a prescribed voltage value; and
    a signal extraction unit for extracting the information signal from a bypass current sent by the shunt regulator for the control when the voltage fluctuates,
    wherein the signal extraction unit generates a current corresponding to the value of the current of the bypass current and outputs the generated current as the information signal and
    the shunt regulator comprises a bypass transistor for controlling the bypass current, wherein the signal extraction unit outputs a current sent by a transistor, of which the same voltage as the gate voltage of the bypass transistor is applied to the gate, as the information signal.

2. The signal extraction circuit according to claim 1, wherein
    the shunt regulator performs the control by sending the bypass current between the drain and the source of the bypass transistor of which the gate voltage is set at a voltage obtained by dividing the voltage, obtained by rectifying the radio frequency signal, by a resistor.

3. The signal extraction circuit according to claim 1, wherein
    the shunt regulator performs the control by sending the bypass current between the drain and the source of the bypass transistor of which the gate voltage is set at a prescribed reference voltage.

4. The signal extraction circuit according to claim 3, wherein
    the value of the reference voltage is set on the basis of the prescribed voltage and of a threshold voltage for turning on the transistor.

5. The signal extraction circuit according to claim 1, further comprising
    a sub-signal extraction unit for extracting the information signal from a current flowing in a rectification circuit rectifying the radio frequency signal, and
    an addition unit for adding the information signal extracted by the signal extraction unit and the information signal extracted by the sub-signal extraction unit.

6. The signal extraction circuit according to claim 1, further comprising
    a sub-signal extraction unit for extracting the information signal from a current flowing in a rectification circuit rectifying the radio frequency signal, and
    a selection unit for selecting either of the information signal extracted by the signal extraction unit and the information signal extracted by the sub-signal extraction unit.

7. The signal extraction circuit according to claim 6, wherein
    the selection unit performs the selection on the basis of the result of comparing between the magnitude of the information signal extracted by the signal extraction unit and that of the information signal extracted by the sub-signal extraction unit.

8. The signal extraction circuit according to claim 5, wherein
    the rectification circuit performs the rectification by sending the radio frequency signal between the drain and the source of a transistor, and
    a voltage which is higher, by the voltage nearby a threshold voltage for turning on the transistor, than the voltage at the rectification output of the transistor is applied to the gate of the transistor.

9. The signal extraction circuit according to claim 6, wherein
    the rectification circuit performs the rectification by sending the radio frequency signal between the drain and the source of a transistor, and
    a voltage which is higher, by the voltage nearby a threshold voltage for turning on the transistor, than the voltage at the rectification output of the transistor is applied to the gate of the transistor.

10. The signal extraction circuit according to claim 7, wherein
    the rectification circuit performs the rectification by sending the radio frequency signal between the drain and the source of a transistor, and
    a voltage which is higher, by the voltage nearby a threshold voltage for turning on the transistor, than the voltage at the rectification output of the transistor is applied to the gate of the transistor.

11. A radio frequency identification tag comprising a signal extraction circuit, wherein
    the signal extraction circuit comprises
    a shunt regulator for performing a control so as to stabilize a voltage obtained by rectifying the radio frequency signal at a prescribed voltage value, and
    a signal extraction unit for extracting the information signal from a bypass current sent by the shunt regulator for the control when the voltage fluctuates,
    wherein the signal extraction unit generates a current corresponding to the value of the current of the bypass current and outputs the generated current as the information signal and
    the shunt regulator comprises a bypass transistor for controlling the bypass current, wherein the signal extraction unit outputs a current sent by a transistor, of which the same voltage as the gate voltage of the bypass transistor is applied to the gate, as the information signal.

12. The radio frequency identification tag according to claim 11, wherein
    the shunt regulator performs the control by sending the bypass current between the drain and the source of the bypass transistor of which the gate voltage is set at a voltage obtained by dividing the voltage, obtained by rectifying the radio frequency signal, by a resistor.

13. The radio frequency identification tag according to claim 11, wherein
    the shunt regulator performs the control by sending the bypass current between the drain and the source of the bypass transistor of which the gate voltage is set at a prescribed reference voltage.

14. A noncontact integrated circuit card comprising a signal extraction circuit, wherein
    the signal extraction circuit comprises
    a shunt regulator for performing a control so as to stabilize a voltage obtained by rectifying the radio frequency signal at a prescribed voltage value, and
    a signal extraction unit for extracting the information signal from a bypass current sent by the shunt regulator for the control when the voltage fluctuates,
    wherein the signal extraction unit generates a current corresponding to the value of the current of the bypass current and outputs the generated current as the information signal and
    the shunt regulator comprises a bypass transistor for controlling the bypass current, wherein the signal extraction unit outputs a current sent by a transistor, of which the same voltage as the gate voltage of the bypass transistor is applied to the gate, as the information signal.

15. The noncontact integrated circuit card according to claim 14, wherein
    the shunt regulator performs the control by sending the bypass current between the drain and the source of the bypass transistor of which the gate voltage is set at a voltage obtained by dividing the voltage, obtained by rectifying the radio frequency signal, by a resistor.

16. The noncontact integrated circuit card according to claim 14, wherein
    the shunt regulator performs the control by sending the bypass current between the drain and the source of the bypass transistor of which the gate voltage is set at a prescribed reference voltage.

* * * * *